United States Patent
Hong

(10) Patent No.: US 8,112,236 B2
(45) Date of Patent: Feb. 7, 2012

(54) DEVICE FOR ACCURATELY MEASURING AMPLIFIER'S OPEN-LOOP GAIN WITH DIGITAL STIMULI

(75) Inventor: Hao-Chiao Hong, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 731 days.

(21) Appl. No.: 12/188,475

(22) Filed: Aug. 8, 2008

(65) Prior Publication Data

US 2009/0171602 A1   Jul. 2, 2009

(30) Foreign Application Priority Data

Dec. 27, 2007   (TW) .................................. 96150435A

(51) Int. Cl.
*G01R 27/00* (2006.01)
(52) U.S. Cl. .......................................................... 702/65
(58) Field of Classification Search ...................... 702/65
See application file for complete search history.

(56) References Cited

U.S. PATENT DOCUMENTS 4,634,997 A * 1/1987 Tompsett et al. ............. 330/284
5,410,310 A * 4/1995 Molnar .......................... 341/143

OTHER PUBLICATIONS

G. Giustolisi and G. Palumbo, "An Approach to Test the Open-Loop Parameters of Feedback Amplifier", *IEEE Transactions on Circuits and Systems I*, vol. 49, No. 1, pp. 70-75, Jan. 2002.
K. Arabi and B. Kaminska, "Design for Testability of Embedded Integrated Operational Amplifiers", *IEEE Journal of Solid-State Circuits*, vol. 33, No. 4, pp. 573-581, Apr. 1998.
M. Burns and G.W. Roberts, "An Introduction to Mixed-Signal IC Test and Measurement", relating to "Open-Loop Gain" for Operational Amplifiers, pp. 68-69, Oxford University Press, N.Y. 2001.
W. M. C. Sansen, M. Steyaert and P. J. V. Vandeloo "Measurement of Operational Amplifier Characteristics in the Frequency Domain", *IEEE Transaction on Instrumentation and Measurement*, vol. IM-34, No. 1, pp. 59-64, Mar. 1985.

* cited by examiner

*Primary Examiner* — Michael Nghiem
(74) *Attorney, Agent, or Firm* — Bui Garcia-Zamor; Hung H. Bui, Esq.

(57) ABSTRACT

A device capable of receiving one or more digital stimulus signals and accurately measuring an open-loop gain of an amplifier comprises: a digital charge converter (DCC), a charge integrator, an A/D converter, a control logic circuit and an arithmetic logic unit (ALU). The DCC and the charge integrator are composed of a plurality of switches, one or more sampling capacitor, at least one integrating capacitor and an operational amplifier under test (OPAUT) with a single-ended output or differential-ended outputs. The DCC, the charge integrator, and the A/D converter are controlled by control signals generated by the logic control circuit and can be reconfigured as a first-order Sigma-Delta modulator capable of receiving at least one of the digital input stimulus signals. The ALU calculates the open-loop gain of the OPAUT with single-ended output or differential-ended outputs according to the digital stimulus signals and the digital output of the first-order Sigma-Delta modulator.

46 Claims, 14 Drawing Sheets

Charge Integrator with the OPAUT

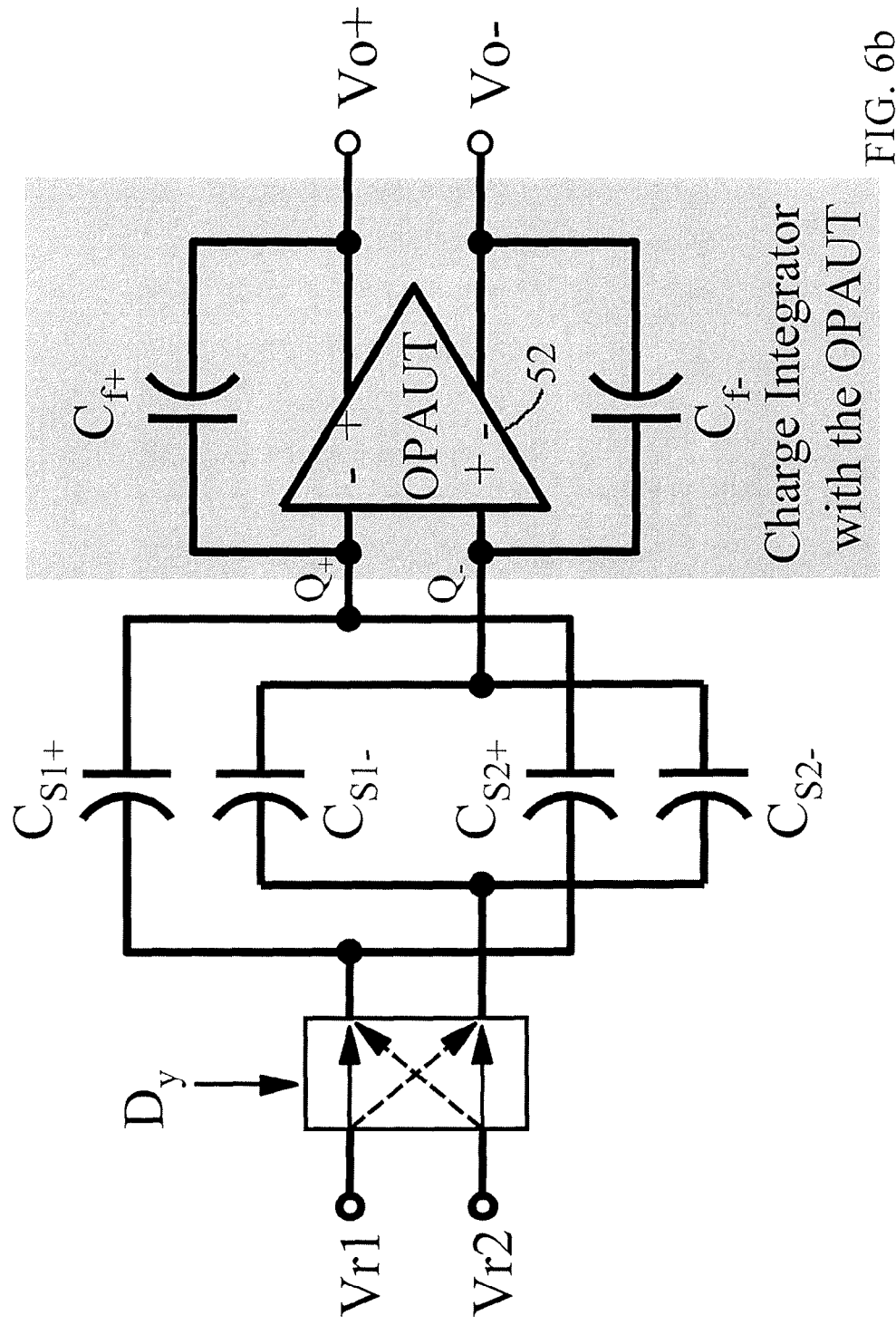
FIG. 6b — Charge Integrator with the OPAUT

DEVICE FOR ACCURATELY MEASURING AMPLIFIER'S OPEN-LOOP GAIN WITH DIGITAL STIMULI

FIELD OF THE INVENTION

The present invention relates to a device capable of accurately measuring an open-loop gain of an amplifier, and more particularly to a device capable of accurately measuring an open-loop gain of an amplifier with digital stimulus signal(s).

BACKGROUND OF THE INVENTION

The function and accuracy of most mixed-signal circuits all heavily rely on the open-loop gains of the operational amplifiers (OPAMPs) in them. Unfortunately the open-loop gains of the OPAMPs are very vulnerable to process variation. Sometimes, even the SPICE (Simulation Program with Integrated Circuit Emphasis) simulation results could not precisely predict what the open-loop gains will be. As a result, accurately measuring the OPAMPs' open-loop gains is important for diagnosing the prototype circuits as well as for production tests.

Traditionally, the open-loop gains are measured with an expensive network analyzer and a tedious testing setup. Modern SOC ICs usually contain tens of OPAMPs which can not drive such heavy off-chip loads. Furthermore, the limited observation pins makes measuring the embedded OPAMPs' open-loop gains being troublesome and costly.

Please refer to the article proposed by G. Giustolisi and G. Palumbo, "An approach to test the open-loop parameters of feedback amplifier", IEEE Trans. On Circuits and Systems I, Vol. 49, No. 1, pp. 70-75, January 2002. The test approach requires a costly network analyzer to measure the phase and magnitude responses of the feedback amplifier made of the operational amplifier under test (OPAUT) to derive the open-loop gain. This method may not be applied to test the OPAUT in an SOC chip due to the limited driving capability of the OPAUT and limited observation nodes of the chip. Besides, it assumes the transfer function of the OPAUT has only two-poles which may not be true. More than two poles in the transfer function of the OPAUT may lead to significant measurement errors.

Please further refer to the article proposed by K. Arabi and B. Kaminska, "Design for Testability of Embedded Integrated Operational Amplifiers", IEEE JSSC, Vol. 33, No. 4, pp. 573-581, April 1998, which disclosed a design for measuring embedded operational amplifier. The authors proposed a method to estimate the gain-bandwidth product of the OPAUT by reconfiguring the OPAUT, auxiliary resistors, and capacitors as an oscillator. Under some assumptions, the gain-bandwidth product of the OPAUT can be derived by observing the oscillation frequency. This method does not require a costly network analyzer; however, it can not measure the open-loop gain of the OPAUT. Beside, its result is sensitive to the parasitic capacitance of the circuits since the parasitic capacitance would change the oscillation frequency.

Please further refer to the book, "An introduction to mixed-signal IC test and measurement", written by M. Burns and G. W. Roberts and published in 2001 by Oxford University, in which a method for measuring the characteristics of amplifier is disclosed in pages 68 & 69. Moreover, W. M. C. Sansen, M. Steyaert and P. J. V. Vandeloo have disclosed "Measurement of operational amplifier characteristics in the frequency domain", IEEE Trans. On instrumentation and measurement, Vol. IM-34, No. 1, pp. 59-64, May, 1985. The above-mentioned two traditional measurement methods require an expensive and precise analog stimulus generator, voltage meter, as well as the auxiliary amplifier. It also requires a huge resistance spread (approximating the open-loop gain). Thus, it is not suitable for embedded implementation.

In accordance with the part of conventional first-order Sigma-Delta modulator, its basic theory and disadvantage are described as follows. Please refer to the block diagram shown in FIG. 1a, which includes a subtractor, a loop filter 1, an A/D converter 2 and a D/A converter 3. FIG. 1b shows the corresponding linear model of FIG. 1a. In terms of the z-domain, the following equation can be derived:

$$Y(z) = \frac{H(z)}{1+H(z)} X(z) + \frac{1}{1+H(z)} E(z) \quad (1)$$

where $Y(z)$ is the output function, $X(z)$ is the input function, $H(z)$ is the discrete-time transfer function of the loop filter, and $E(z)$ is the quantization error generated by the first-order Sigma-Delta modulator.

Eq. (1) can be generalized and expressed as the following equation:

$$Y(z) = STF(z)X(z) + NTF(z)E(z) \quad (2)$$

where $STF(z)$ and $NTF(z)$ are defined as the signal transfer function (STF) and noise transfer function (NTF) of a Sigma-Delta modulator respectively. For the example shown in FIG. 1a, the STF and NTF can be shown to be $$STF(z) = \frac{H(z)}{1+H(z)} \quad (3)$$

$$NTF(z) = \frac{1}{1+H(z)} \quad (4)$$

If the $STF(z)$ is designed to have the characteristics of a low-pass or an all-pass filter and the $NTF(z)$ is designed to have the characteristics of a high-pass filter, it is known from Eq. (3) and (4) that most of quantization noise will be shifted to the high-frequency range after the input signal $X(z)$ has been processed by the Sigma-Delta modulation. As a result, the quantization noise left within the base band range of signal will be greatly reduced. The shaped high-frequency quantization noise could be filtered out by using a digital low-pass filter. An example to achieve the objectives is choosing $$H(z) = \frac{1}{z-1} = \frac{z^1}{1-z^1}, \quad (5)$$

that is, exerting an integrator as the loop filter.

Detailed circuit analysis indicates that under some proper test setting, the gain error of the first-order Sigma-Delta modulator is mainly determined by the open-loop gain of the operational amplifier that constitutes the integrator. Hence, if the gain error of the first-order Sigma-Delta modulator could be accurately measured, the open-loop gain of the operational amplifier could be calculated accordingly. The input portion of conventional Sigma-Delta modulator can not but accepts analog signals as its inputs, while analog signals are hard to be precisely controlled and are prone to be disturbed by the test setting and environmental noise. Hence, using analog signals to perform the gain error test shall employ the analog signal source that can be precisely controlled. Such high-quality signal source usually could be provided by high-end test equipment only. Besides, how to prove that the test setting and testing environment won't result in additional errors is again a hard nut to crack. Therefore, using analog signals to test the open-loop gain of the OPAUT has not only higher difficulty but also higher cost.

To improve the shortcomings of the aforementioned prior arts and precisely measure the open-loop gain of the operational amplifier, the present invention specifically discloses a first-order Sigma-Delta modulator composed of simple components including an OPAUT, a plurality of switches, a plurality of capacitors, an A/D converter, and a plurality of DC voltage sources, and particularly specifies a device that could use purely digital stimuli to precisely measure the open-loop gain of the OPAUT.

The first object of the present invention is to provide a device that could be utilized to measure the open-loop gain of the OPAUT with a single-ended output or differential-ended output.

The second object of the present invention is to provide a first-order Sigma-Delta modulator which is reconfigured by a plurality of switches, a plurality of capacitors, an A/D converter, an OPAUT and a digital circuit, and can receive at least one or more digital input stimulus signals in a test mode.

The third object of the present invention is to provide a first-order Sigma-Delta modulator which is constructed by a plurality of switches, a plurality of capacitors, an A/D converter, an OPAUT, and a digital circuit and can receive one or more digital input stimulus signals.

SUMMARY OF THE INVENTION

A first aspect of the present invention is to provide a device capable of receiving one or more digital input stimulus signals and accurately measuring the open-loop gain of an OPAUT. The device includes: a digital charge converter (DCC), composed of one or more sampling capacitors and a plurality of switches for receiving a plurality of control signals and a plurality of reference signals to output a charge signal; a charge integrator, comprising an OPAUT with a single-end output and at least one integrating capacitor for receiving the charge signal of the DCC and at least one of the reference signals and outputting an integration signal, the OPAUT including a positive input and a negative input, the integration signal being generated by amplifying a potential difference across the positive input and the negative input; an A/D converter, receiving the integration signal of the charge integrator and at least one of the reference signals, and then outputting a digital feedback signal which comprises at least two logic states, i.e., a maximum logic state and a minimum logic state; a control logic circuit, at least receiving a clock signal (CLK), the digital input stimulus signal, and the digital feedback signal for generating the control signals so as to control the switches and the A/D converter, wherein each of the digital input stimulus signals is a Sigma-Delta modulated digital stimulus bit-stream which comprises two logic states, i.e., a first logic state and a second logic state, and the clock signal (CLK) is utilized to generate at least two non-overlap clock phases comprising a first clock phase and a second clock phase; and an arithmetic logic unit (ALU), at least receiving the digital input stimulus signals and the digital feedback signal for computing the open-loop gain of the OPAUT.

When a digital-mode signal (T) received by the control logic circuit is in a test mode, the switches, the sampling capacitors, the integrating capacitor, the OPAUT, the control logic circuit and the A/D converter can be reconfigured as a first-order Sigma-Delta modulator capable of receiving the digital input stimulus signals.

A second aspect of the present invention is to provide a device capable of receiving one or more digital input stimulus signals and accurately measuring the open-loop gain of an OPAUT. The device includes: a digital charge converter (DCC), composed of at least one sampling capacitor pair composed of a first sampling capacitor ($C_{S+}$) and a second sampling capacitor ($C_{S-}$) and a plurality of switches for at least receiving a plurality of reference signals and a plurality of control signals to output two charge signals; a charge integrator, comprising an OPAUT with a differential-ended output and at least one integrating capacitor pair composed of a first integrating capacitor ($C_{f+}$) and a second integrating capacitor ($C_{f-}$) for receiving the charge signals of the DCC and outputting an integration signal, the OPAUT including a positive input, a negative input, a positive output and a negative output, the integration signal being generated between the positive output and the negative output by amplifying a potential difference across the positive input and the negative input; an A/D converter, receiving the integration signal of the charge integrator and outputting a digital feedback signal which at least comprises two logic states, i.e., a maximum logic state and a minimum logic state; a control logic circuit, at least receiving a clock signal (CLK), at least one of the digital input stimulus signals and the digital feedback signal for generating the control signals to control the switches, wherein each of the digital input stimulus signals is a Sigma-Delta modulated digital stimulus bit-streams which comprises two logic states, i.e., a first logic state and a second logic state, and the clock signal (CLK) is utilized to generate at least two non-overlap clock phases comprising a first clock phase and a second clock phase; and an arithmetic logic unit (ALU), at least receiving the digital input stimulus signals and the digital feedback signal for computing the open-loop gain of the OPAUT.

A third aspect of the present invention is to further include at least one independently switching capacitor ($C_R$) or at least one independently switching capacitor pair independently switching the reference signals among the negative input and the positive input of the OPAUT depending on the logical state of the digital feedback signal independent of the reference signals.

The above objects and still other objects, characteristics and advantages will be apparent and best understood from the following description of specific embodiments when read in connection with the accompanying drawings

BRIEF DESCRIPTION OF THE DRAWINGS

FIG. 6a and FIG. 6b are circuit diagrams showing when the digital charge converter and the charge integrator in FIG. 5 are operated in a first clock phase and a second clock phase, respectively;

DETAILED DESCRIPTION OF THE PREFERRED EMBODIMENT

Figure 1A:
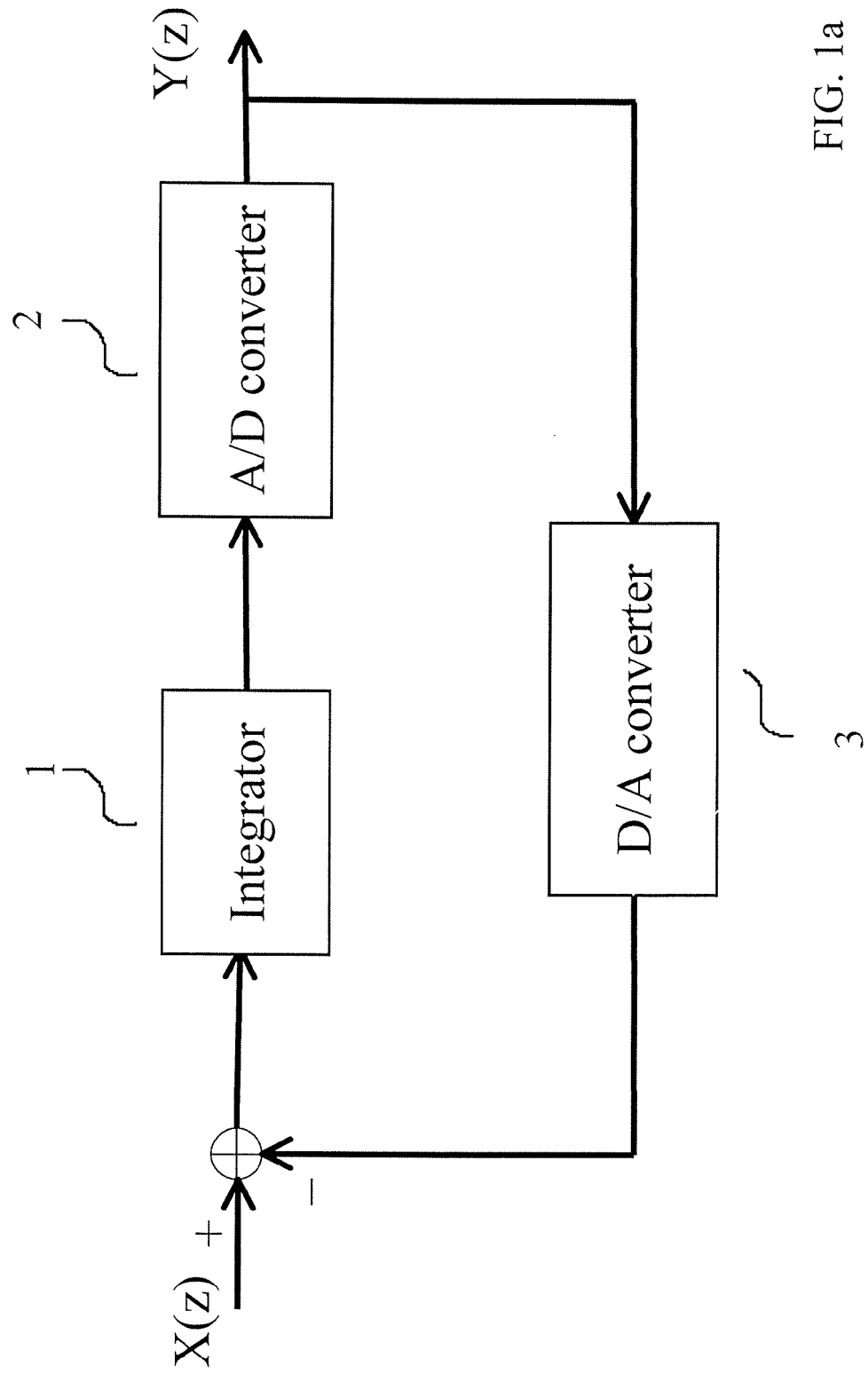
FIG. 1a and FIG. 1b are block diagrams of a conventional first-order Sigma-Delta modulator and a corresponding linear model thereof.
Figure 1B:
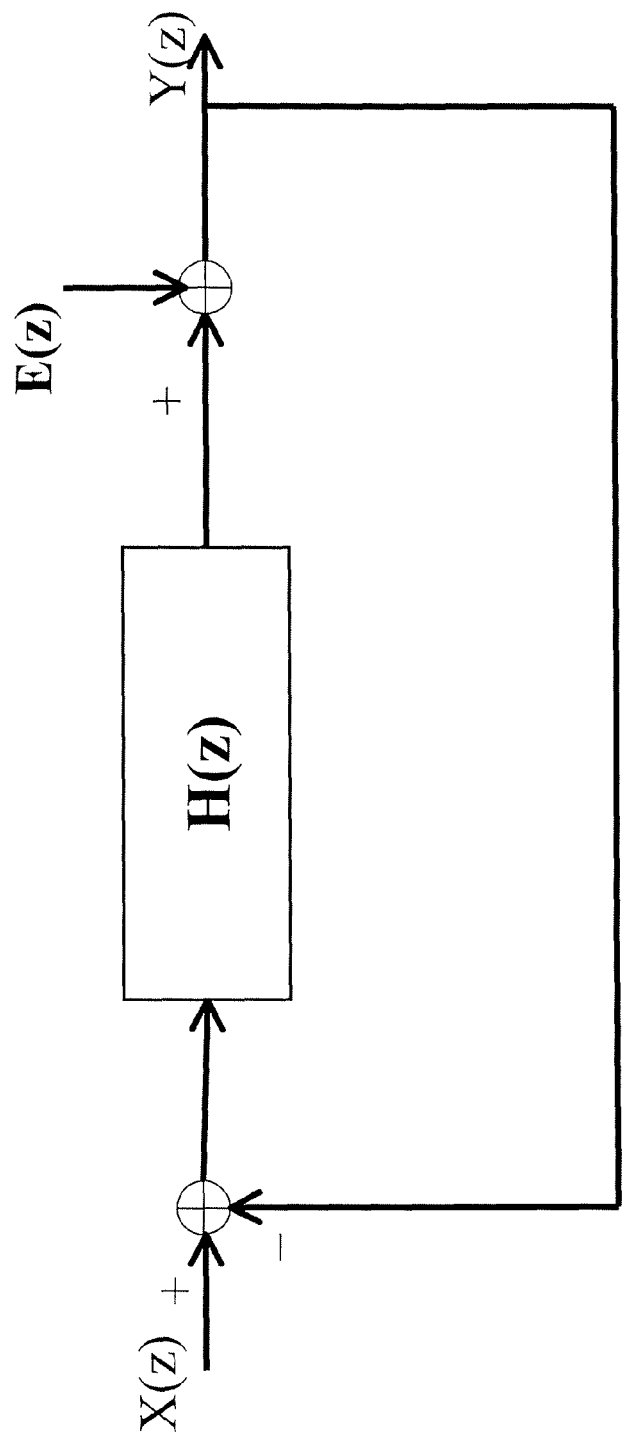
Figure 2:
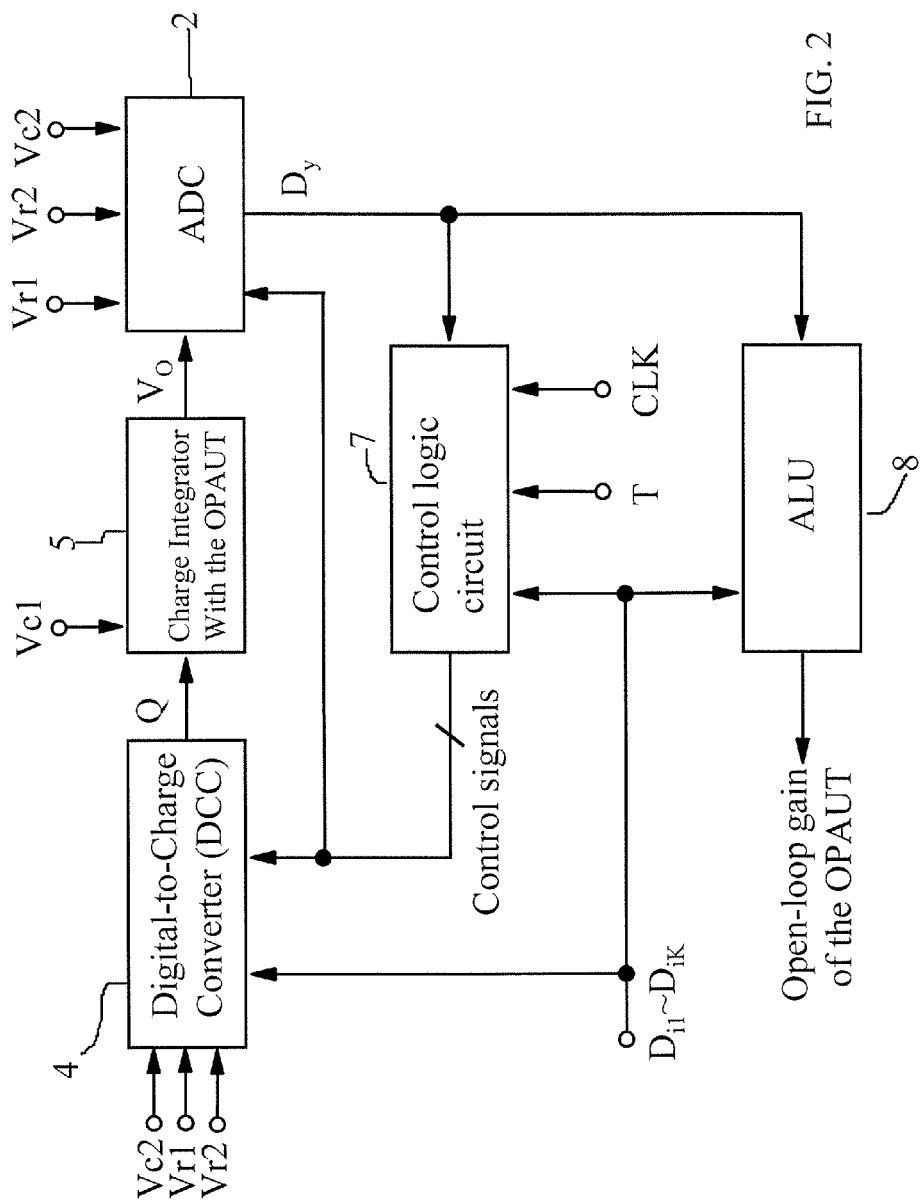
FIG. 2 is a block diagram showing a device capable of receiving one or more digital input stimulus signals and accurately measuring the open-loop gain of an OPAUT in accordance with a first preferred embodiment of the present invention.

With reference to FIG. 2, a device capable of receiving one or more digital input stimulus signals and accurately measuring the open-loop gain of an OPAUT in accordance with a first embodiment of the present invention is shown in a block diagram. As shown in FIG. 2, the device includes a digital charge converter (DCC) 4, a charge integrator 5, an A/D converter 2, a control logic circuit 7 and an arithmetic logic unit (ALU) 8. The digital charge converter (DCC) 4 is composed of one or more sampling capacitors and a plurality of switches controlled by a plurality of control signals and outputs a charge signal based on at least one of the digital input stimulus signals, a digital feedback signal and a plurality of reference signals. Each of the digital input stimulus signals is a Sigma-Delta modulated digital stimulus bit-stream which comprises two logic states, i.e., a first logic state and a second logic state. The charge integrator 5 includes an OPAUT 51 with a single-ended output and at least one integrating capacitor for receiving the charge signal of the DCC and at least one of the reference signals and then outputting an integrating signal. The OPAUT 51 includes a positive input and a negative input. The integrating signal is generated by amplifying a potential difference across the positive input and the negative input. The A/D converter 2 receives the integrating signal of the charge integrator 5 and at least one of the reference signals and outputs a digital feedback signal. The digital feedback signal comprises at least two logic states, i.e., a maximum logic state and a minimum logic state. The control logic circuit 7 at least receives a clock signal (CLK), the digital input stimulus signals and the digital feedback signal for generating the control signals to control the switches within the DCC 4 and the A/D converter 2. The clock signal is utilized to generate at least two non-overlap clock phases which comprises a first clock phase and a second clock phase. The arithmetic logic unit (ALU) 8 at least receives the digital input stimulus signals and the digital feedback signal for calculating the open-loop gain of the OPAUT 51.

Besides, the control logic circuit could further receive a digital-mode signal T which comprises at least two states, i.e., a normal-mode state (e.g. T=0) and a test-mode state (e.g. T=1). When the digital-mode signal T received by the control logic circuit 7 is in the test-mode state, the switches, the sampling capacitor, the OPAUT 51, the integrating capacitor, the A/D converter 2 and the control logic circuit 7 can be reconfigured as a first-order Sigma-Delta integrating modulator capable of receiving the digital input stimulus signals as shown in FIG. 2.

The reference signals include a first reference signal (Vc1), a second reference signal (Vc2), a third reference signal (Vr1) and a fourth reference signal (Vr2). If the OPAUT is in an ideal condition, and if the first logic state of the digital input stimulus signals is defined as +1, the second logic state of the digital input stimulus signals is defined as −1, the maximum logic state of the digital feedback signal is defined as +1, the minimum logic state of the digital feedback signal is defined as −1, then a Z-domain transfer function of the DCC 4 can be is expressed as:

$$-\left[\sum_{k=1}^{N} C_{sk}D_{ik}(z) - C_s z^{-1} D_y(z)\right] V_{ref} + C_s (V_{c2} - V_{c1}) \qquad (6)$$

where N a natural number representing the number of the digital input stimulus signals, $D_{ik}$, K=1,...N, are the digital input stimulus signals controlling the sampling capacitors, $C_{sk}$ is capacitance of the sampling capacitor controlled by the digital input stimulus signals $D_{ik}(z)$ and $$C_s = \sum_{k=1}^{N} C_{sk},$$

$D_y$ is the digital feedback signal and $-1 \leq D_y \leq 1$, and $V_{ref}$ is half of the difference between the third reference signal (Vr1) and the fourth reference signal (Vr2). Furthermore, a Z-domain transfer function of the charge integrator 5 can be expressed as $$\frac{-1}{\left(1+\frac{1}{A}\right)C_f} \frac{1}{1-z^{-1}} \qquad (7)$$

where $C_f$ is capacitance of the integrating capacitor, and A is the open-loop gain of the OPAUT 51.

The aforementioned digital input stimulus signals and the digital feedback signal fulfill the following equation:

$$D_y(z) = \sum_{k=1}^{N} STF_k(z) D_{ik}(z) + NTF(z) E(z) + D_C \qquad (8)$$

where $D_y$ is the digital feedback signal, $D_C$ is a constant dependent of the circuit structure and the reference signals but independent of frequency, $D_{ik}(z)$, k∈{1,...,N}, are the digital input stimulus signals, $STF_k(z)$ represents a transfer function with respect to the digital input stimulus signals $D_{ik}(z)$ E(z) is a quantization error generated by the A/D converter 2, NTF (Z) is a transfer function of quantization error of the device, and N is a natural number representing the number of the digital input stimulus signals.

At least one of the digital input stimulus signals of the above-mentioned device includes a low-frequency sinusoidal wave. The ALU 8 calculates a transfer function of the sinusoidal wave and obtains the open-loop gain of the OPAUT 51 in accordance with the following equation:

$$\left. \frac{D_y(j2\pi f)}{\sum_{k=1}^{N} \frac{C_{sk}}{C_s} D_{ik}(j2\pi f)} \right|_{f=f_{in}} = \frac{1}{e^{-j\frac{2\pi f_{in}}{f_{clk}}} + \frac{1}{A} + \frac{C_f}{C_s}\left(1 + \frac{1}{A}\right)\left(1 - e^{-j\frac{2\pi f_{in}}{f_{clk}}}\right)} \quad (9)$$

where $f_{in}$ is a frequency of the low-frequency sinusoidal wave, $f_{clk}$ is a frequency of the clock phase, A is the open-loop gain of the OPAUT 51, $$C_s = \sum_{k=1}^{N} C_{sk},$$

and N is a natural number representing the number of the digital input stimulus signals. Besides, the ALU 8 further obtains the open-loop gain of the OPAUT 51 in accordance with the following equation:

$$\left\| \frac{D_y(j2\pi f)}{\sum_{k=1}^{N} \frac{C_{sk}}{C_s} D_{ik}(j2\pi f)} \right\|_{f=f_{in}} = \frac{1}{1 + \frac{1}{A}} \cong 1 - \frac{1}{A} \quad (10)$$

As mentioned in the foregoing description, the ALU 8 further obtains the open-loop gain of the OPAUT 51 by calculating an inverse of an absolute value of a low-frequency gain error. Furthermore, it should be understood that approximate solutions of the open-loop gain of the OPAUT 51 calculated by a person having ordinary skill in the related field in accordance with the foregoing description and equations or figures by using the ALU 8 or other similar device such as a digital signal processor (DSP), a microprocessor or the like are still included within the spirit and scope defined by the claims of the present invention.

Figure 3A:
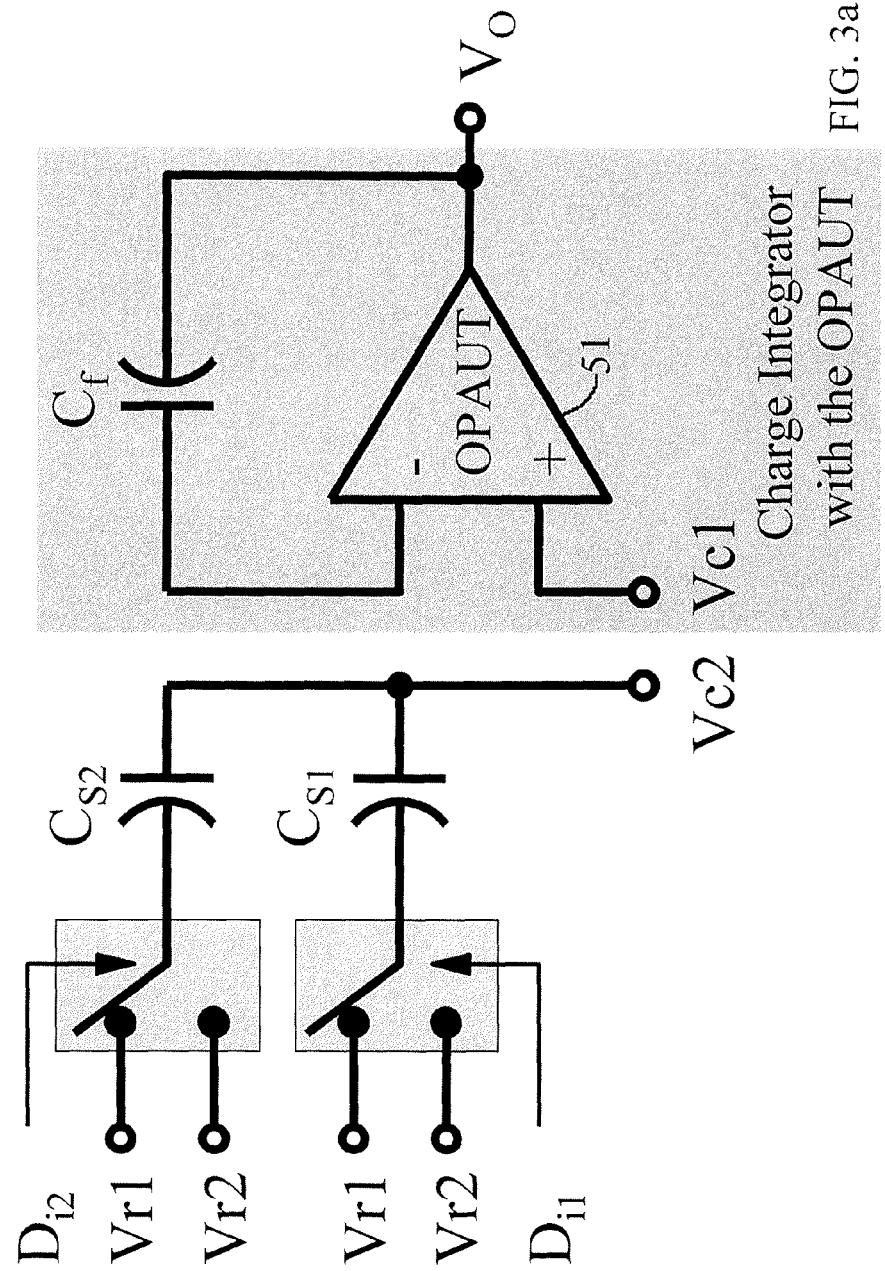
FIG. 3a and FIG. 3b are the circuit diagrams showing when the digital charge converter and the charge integrator in FIG. 2 are operated in a first clock phase and a second clock phase, respectively.
Figure 3B:
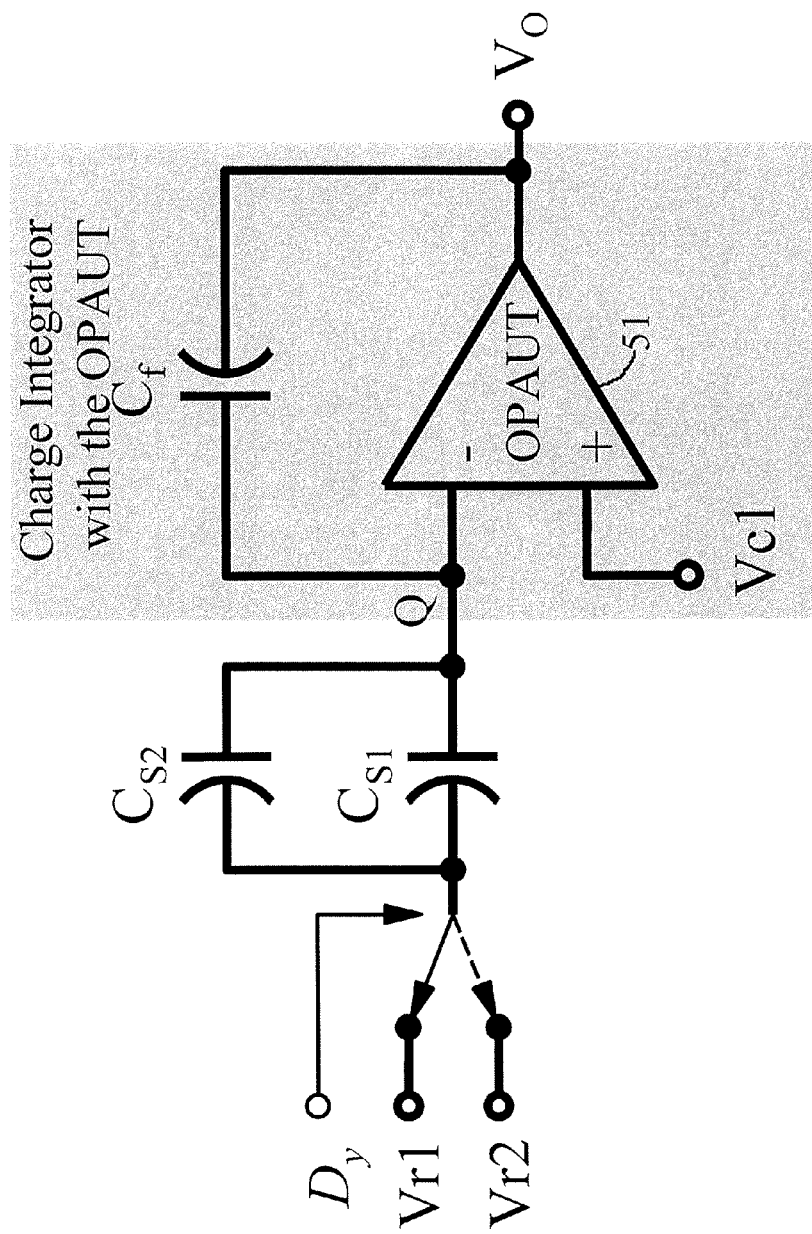

With reference to FIG. 3a and FIG. 3b, where N is equal to 2, FIG. 3a and FIG. 3b show the DCC 4 and the charge integrator 5 in FIG. 2 operated in the first clock phase and second clock phase respectively. Each of the sampling capacitors ($C_{s1}$, $C_{s2}$) and the integrating capacitor ($C_f$) has a negative plate and a positive plate. The OPAUT 51 with a negative input connected to the positive plate of the integrating capacitor ($C_f$) and a positive input connected to the first reference signal (Vc1) is an operational amplifier with a single-ended output. The integrating signal of the OPAUT 51 is connected to the negative plate of the integrating capacitor ($C_f$).

FIG. 3a shows that the device is operated in the first clock phase. In FIG. 3a, the arrowed solid line represents a connection condition when the digital input stimulus signals $D_{ik}$ are in the first logic state while the arrowed dash line represents a connection condition when the digital input stimulus signals $D_{ik}$ are in the second logic state. When each of the digital input stimulus signals is in the first logic state, negative plates of the corresponding sampling capacitors ($C_{s1}$, $C_{s2}$) are connected to the third reference signal (Vr1). When each of the digital input stimulus signals is in the second logic state, the negative plates of the corresponding sampling capacitors ($C_{s1}$, $C_{s2}$) are connected to the fourth reference signal (Vr2). The positive plate of each of the sampling capacitors ($C_{s1}$, $C_{s2}$) is connected to the second reference signal (Vc2).

FIG. 3b shows that the device is operated in the second clock phase. In FIG. 3b, the arrowed solid line represents a connection condition when the digital feedback signal $D_y$ is in the maximum logic state while the arrowed dash line represents a connection condition when the digital feedback signal $D_y$ is in the minimum logic state. When the digital feedback signal is in the maximum logic state, the negative plate of each of the corresponding sampling capacitors ($C_{s1}$, $C_{s2}$) is connected to the third reference signal (Vr1). When the digital feedback signal is in the minimum logic state, the negative plate of each of the corresponding sampling capacitors ($C_{s1}$, $C_{s2}$) is connected to the fourth reference signal (Vr2). The positive plate of each of the sampling capacitors ($C_{s1}$, $C_{s2}$) is connected to the negative input of the OPAUT 51.

It should be noted that the first reference signal (Vc1) could be the second reference signal (Vc2), the third reference signal (Vr1) or the fourth reference signal (Vr2). In addition, the second reference signal (Vc2) could also be the third reference signal (Vr1) or the fourth reference signal (Vr2).

Subsequently, a second preferred embodiment of the present invention is described in details. In addition to the components included in the first preferred embodiment, the device in this embodiment capable of receiving one or more digital stimulus signals and accurately measuring the open-loop gain of an OPAUT further comprises at least one independently switching capacitor in the DCC 4 so that the independently switching capacitor could independently switch the reference signals among the negative input and the positive input of the OPAUT 51 in accordance with the logic state of the digital feedback signal independent of the reference signals.

In this embodiment, the reference signals comprises a first reference signal (Vc1), a second reference signal (Vc2), a third reference signal (Vr1) and the fourth reference signal (Vr2). If the OPAUT is in an ideal condition, and if the first logic state of the digital input stimulus signals is defined as +1, the second logic state of the digital input stimulus signals is defined as −1, the maximum state of the digital feedback signal is defined as +1, the minimum state of the digital feedback signal is defined as −1, then a Z-domain transfer function of the DCC 4 can be expressed as $$-\left[\sum_{k=1}^{N} C_{sk} D_{ik}(z) - C_R z^{-1} D_y(z)\right] V_{ref} - (C_s + C_R)(V_{cm} - V_{c2}) \quad (11)$$

where N is a natural number representing the number of the digital input stimulus signals, $D_{ik}$, k=1, ... N, are the digital input stimulus signals controlling the sampling capacitors, $C_{sk}$ is capacitance of the sampling capacitor controlled by the digital input stimulus signals $D_{ik}(z)$ and $$C_s = \sum_{k=1}^{N} C_{sk},$$

$D_y$ is the digital feedback signal and $-1 \leq D_y \leq 1$, $C_R$ is total capacitance value of the independently switching capacitor, $V_{ref}$ is half of the difference between the third reference signal (Vr1) and the fourth reference signal (Vr2). Besides, the Z-domain transfer function of the charge integrator 5 can be expressed as $$\frac{-1}{\left(1+\frac{1}{A}\right)C_f}\frac{1}{1-z^{-1}} \quad (12)$$

where $C_f$ is capacitance of the integrating capacitor, and A is the open-loop gain of the OPAUT.

As at least one of the digital input stimulus signals includes a low-frequency sinusoidal wave, the ALU calculates a transfer function of the sinusoidal wave and obtains the open-loop gain of the OPAUT 51 in accordance with the following equation:

$$\left.\frac{D_y(j2\pi f)}{\sum_{k=1}^{N}\frac{C_{sk}}{C_R}D_{ik}(j2\pi f)}\right|_{f=f_{in}} = \frac{1}{e^{-j\frac{2\pi f_{in}}{f_{clk}}}+\frac{1}{A}\left(1+\frac{C_S}{C_R}\right)+\frac{C_f}{C_R}\left(1+\frac{1}{A}\right)\left(1-e^{-j\frac{2\pi f_{in}}{f_{clk}}}\right)} \quad (13)$$

where $f_{in}$ is a frequency of the low-frequency sinusoidal wave, $f_{clk}$ is a frequency of the clock phase, A is the open-loop gain of the OPAUT 51, and N is a natural number representing the number of the digital input stimulus signals. With reference to Eq. (13), if $f_{in}$ is far less than $f_{clk}$, then the ALU calculates the open-loop gain of the OPAUT 51 by multiplying an inverse of an absolute value of a low-frequency gain error by $$\left(1+\frac{C_S}{C_R}\right).$$

In addition, the ALU 8 further obtains the open-loop gain of the OPAUT 51 in accordance with the following equation:

$$\left.\frac{D_y(j2\pi f)}{\sum_{k=1}^{N}\frac{C_{sk}}{C_R}D_{ik}(j2\pi f)}\right|_{f=f_{in}} = \frac{1}{1+\frac{1}{A}\left(1+\frac{C_S}{C_R}\right)_\square} \quad (14)$$

Approximate solutions for the open-loop gain of the OPAUT 51 calculated by a person having ordinary skill in the related field in accordance with the aforementioned description and equations or figures by using the ALU 8 or other similar device such as a digital signal processor (DSP), a microprocessor or the like are still included within the spirit and scope defined by the claims of the present invention.

Figure 4A:
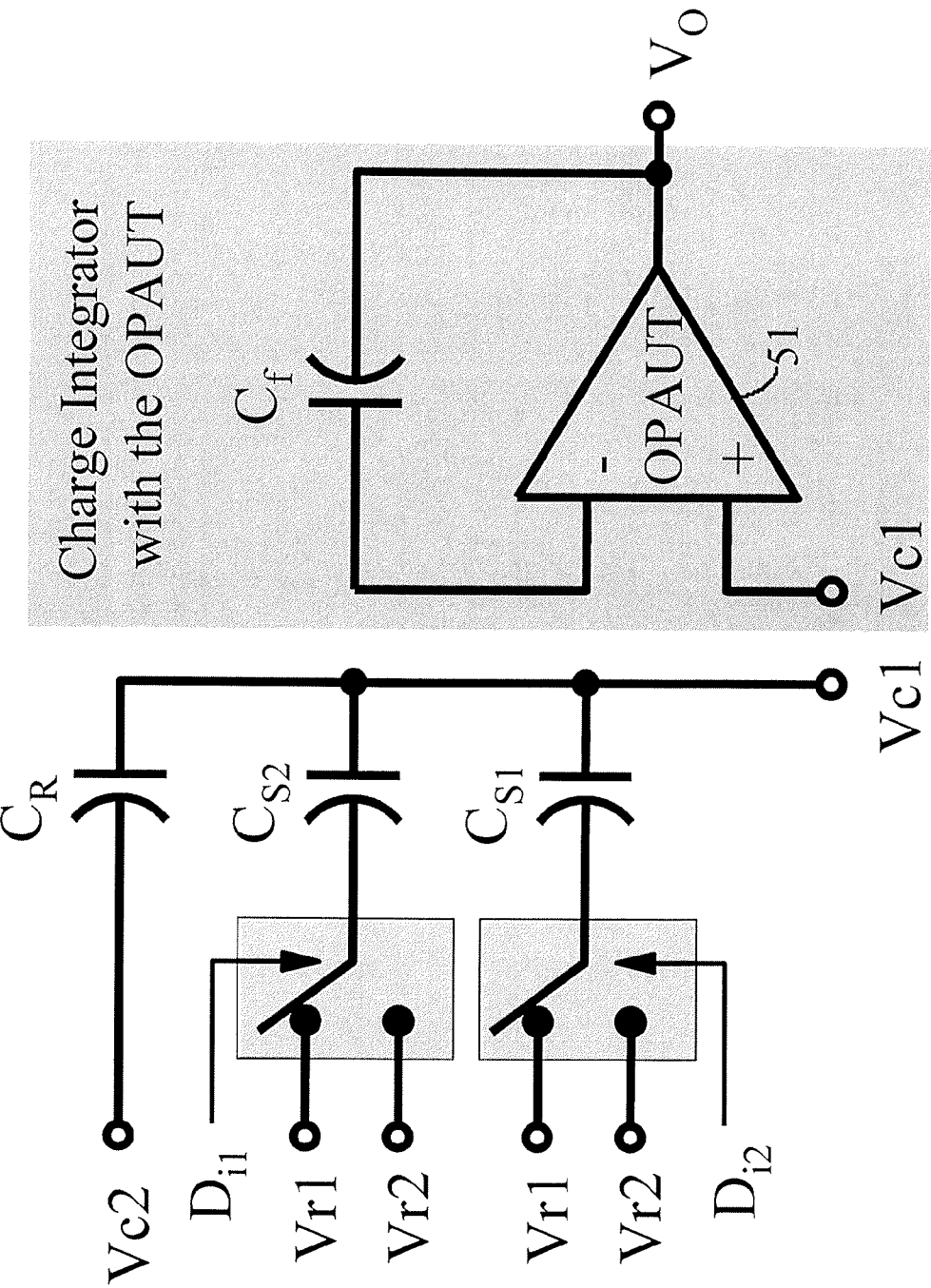
FIG. 4a and FIG. 4b are the circuit diagrams showing when the digital charge converter and the charge integrator in a second preferred embodiment of the present invention are operated in a first clock phase and a second clock phase, respectively.
Figure 4B:
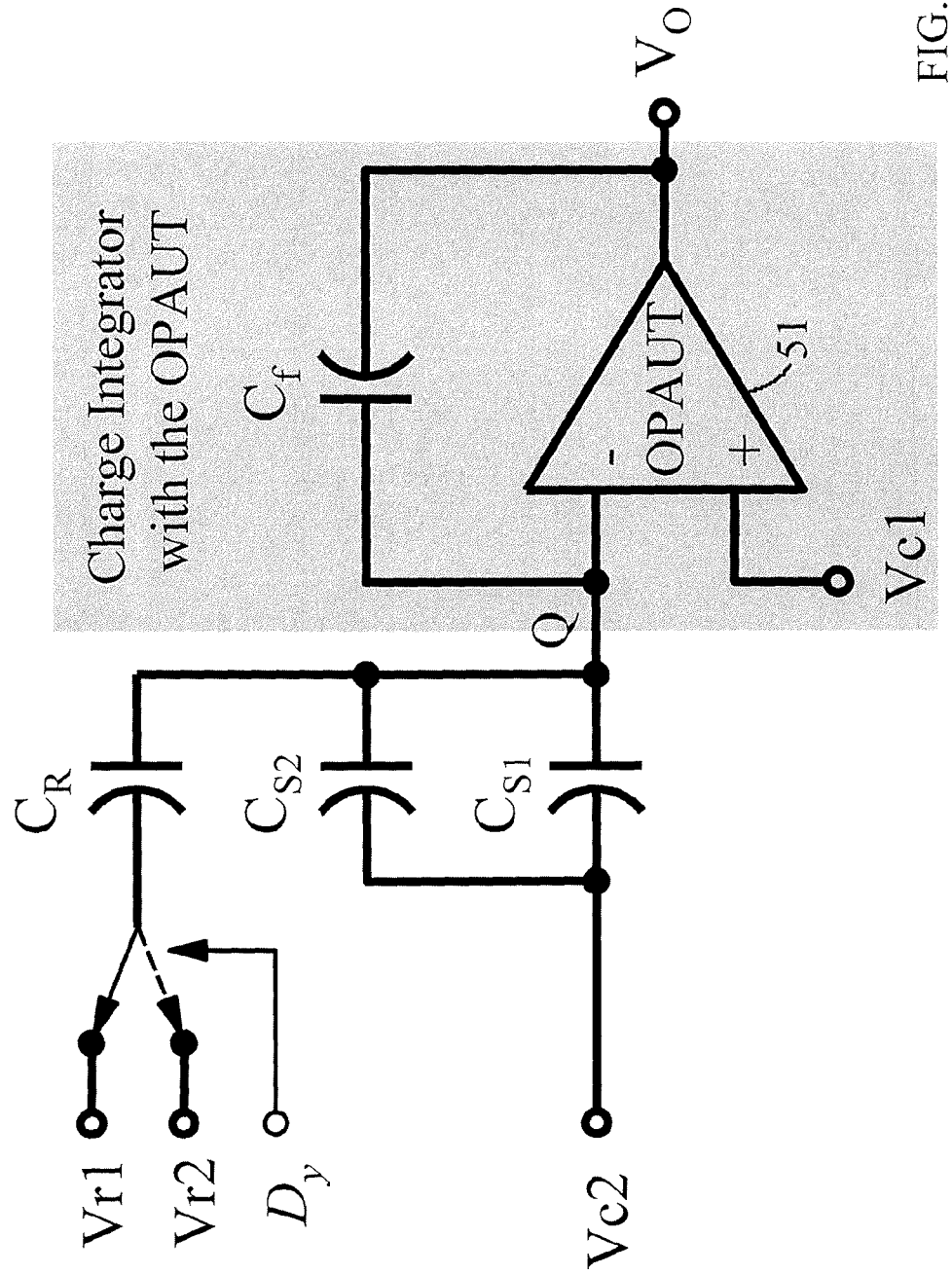

Next, with reference to FIG. 4a and FIG. 4b, FIG. 4a and FIG. 4b shows the DCC 4 and the charge integrator 5 of the second preferred embodiment of the present invention operated in the first clock phase and the second clock phase, respectively. The negative input of the OPAUT 51 is connected to the positive plate of the integrating capacitor ($C_f$). The positive input of the OPAUT 51 is connected to the first reference signal (Vc1). The output of the integration signal of the OPAUT 51 is connected to the negative plate of the integrating capacitor ($C_f$).

FIG. 4a shows that the device is operated in the first clock phase. In FIG. 4a, the arrowed solid line represents a connection condition when the digital input stimulus signals $D_{ik}$ are in the first logic state while the arrowed dash line represents a connection condition when the digital input stimulus signals $D_{ik}$ are in the second logic state. The negative plate of the independently switching capacitor $C_R$ is connected to the second reference signal (Vc2). When each of the digital input stimulus signals is in the first logic state, the negative plates of the corresponding sampling capacitors ($C_{s1}$, $C_{s2}$) are connected to the third reference signal (Vr1). When each of the digital input stimulus signals is in the second logic state, the negative plates of the corresponding sampling capacitors ($C_{s1}$, $C_{s2}$) are connected to the fourth reference signal (Vr2). The positive plates of the sampling capacitors ($C_{s1}$, $C_{s2}$) and the independently switching capacitor ($C_R$) are connected to the first reference signal (Vc1). FIG. 4b shows that the device is operated in the second clock phase. In FIG. 4b, the arrowed solid line represents a connection condition when the digital feedback signal $D_y$ is in the maximum state while the arrowed dash line represents a connection condition when the digital feedback signal $D_y$ is in the minimum logic state. When the digital feedback signal is in the maximum logic state, the negative plate of the independently switching capacitor ($C_R$) is connected to the third reference signal (Vr1). When the digital feedback signal is in the minimum logic state, the negative plate of the independently switching capacitor ($C_R$) is connected to the fourth reference signal (Vr2), and the negative plates of the sampling capacitors ($C_{s1}$, $C_{s2}$) are connected to the second reference signal (Vc2); The positive plates of the independently switching capacitor ($C_R$) and the sampling capacitors ($C_{s1}$, $C_{s2}$) are connected to the negative input of the OPAUT 51.

Figure 5:
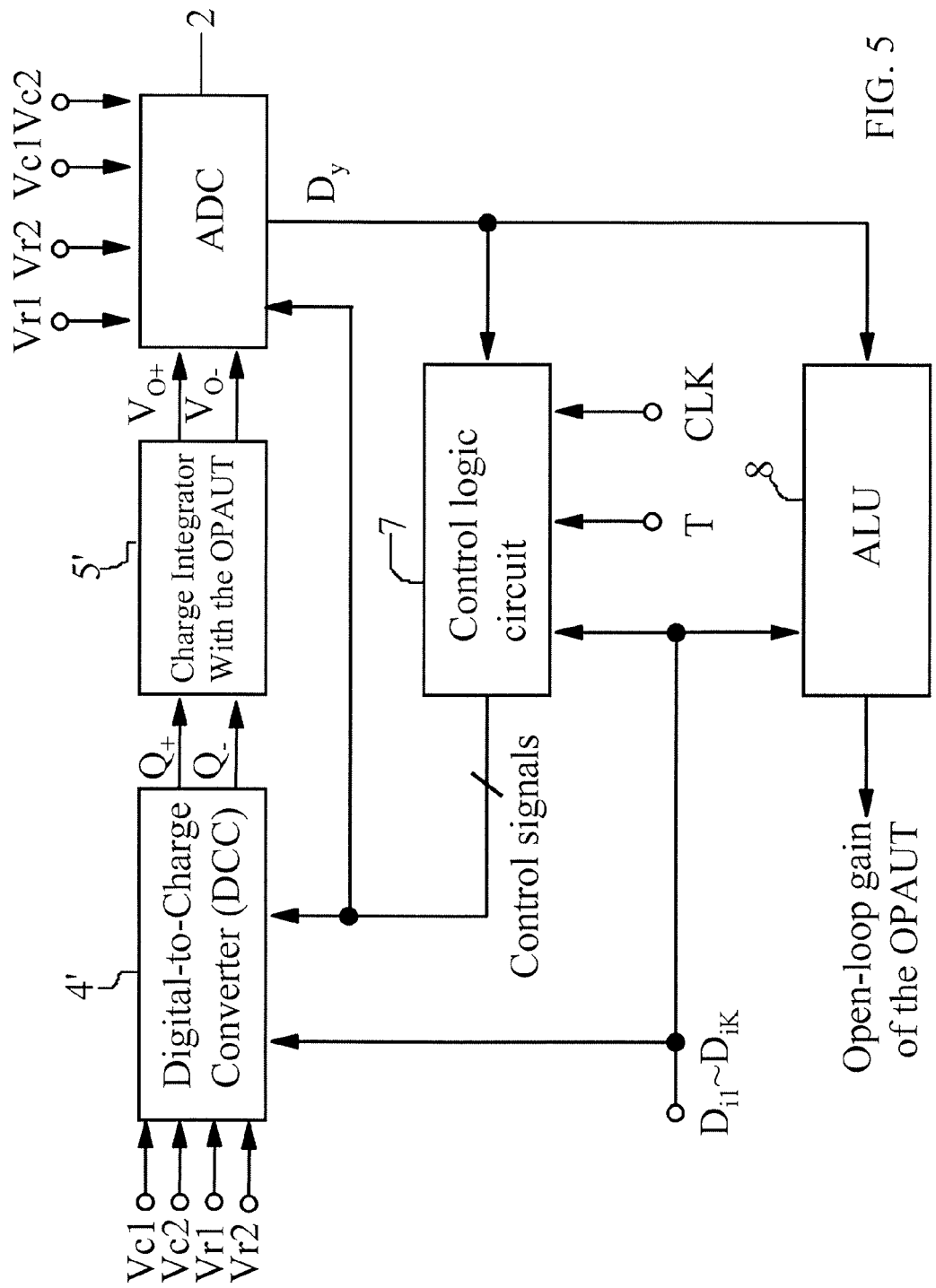
FIG. 5 is a block diagram showing a device capable of receiving one or more digital input stimulus signals and accurately measuring the open-loop gain of an OPAUT in accordance with a third preferred embodiment of the present invention.

With reference to FIG. 5, FIG. 5 shows a device capable of receiving one or more digital input stimulus signals and accurately measuring the open-loop gain of an OPAUT in accordance with a third preferred embodiment of the present invention. The device includes a digital charge converter (DCC) 4', a charge integrator 5', an Analog/Digital (A/D) converter 2, a control logic circuit 7, and an arithmetic logic unit (ALU) 8. The DCC 4' is composed of one or more sampling capacitor pairs and a plurality of switches for receiving a plurality of control signals and a plurality of reference signals so as to generate two charge signals. Each the sampling capacitor pairs is composed of a first sampling capacitor ($C_{sk+}$) and a second sampling capacitor ($C_{sk-}$) where k is an index number of the sampling capacitor pair. The charge integrator 5' includes an OPAUT 52 with a differential-ended output, at least one of the reference signals and at least one integrating capacitor ($C_{f+}$, $C_{f-}$) pair for receiving the charge signals of the DCC 4' and outputting an integration signal. The integrating capacitor pair is constituted by a first integrating capacitor ($C_{f+}$) and a second capacitor ($C_{f-}$). The OPAUT 52 includes a positive input, a negative input, a positive output and a negative output. The integration signal is generated between the positive output and the negative output by amplifying a potential difference across the positive input and the negative input. The A/D converter 2 receives the integration signal of the charge integrator 5' and outputs a digital feedback signal. The control logic circuit 7 at least receives a clock signal (CLK), at least one of the digital input stimulus signals and the digital feedback signal for generating the control signals to control the switches. Each of the digital input stimulus signals is a Sigma-Delta modulated digital stimulus bit-stream which comprises two logic states, i.e., a first logic state and a second logic state. The digital feedback signal at least comprises two logic states, i.e., a maximum logic state and a minimum logic state. The clock signal is utilized to generate at least two non-overlap clock phases comprising a first clock phase and a second clock phase. The arithmetic logic unit (ALU) 8 at least receives the digital input stimulus signals and the digital feedback signal for calculating the open-loop gain of the OPAUT 52. Besides, the digital input stimulus signals and the digital feedback signal also fulfill the equation as expressed by Eq. (8).

In this embodiment, the control logic circuit further receives a digital-mode signal T which comprises at least two states, i.e., a normal-mode state (e.g. T=0) and a test-mode state (e.g. T=1). When the digital-mode signal received by the control logic circuit 7 is in the test-mode state, the switches, the sampling capacitor pairs, the integrating capacitor pair, the OPAUT 52, the A/D converter and the control logic circuit 7 can be reconfigured as a first-order Sigma-Delta modulator capable of receiving the digital input stimulus signals.

Moreover, the reference signals includes a first reference signal (Vc1), a second reference signal (Vc2), a third reference signal (Vr1) and a fourth reference signal (Vr2). If the OPAUT is in an ideal condition, and if the first logic state of the digital input stimulus signals is defined as +1, the second logic state of the digital input stimulus signals is defined as −1, the maximum state of the digital feedback signal is defined as +1, the minimum logic state of the digital feedback signal is defined as −1, then a Z-domain transfer function outputted by a net charge of the DCC can be expressed as $$-\left[\sum_{k=1}^{N} C_{sdk} D_{ik}(z) - C_{sd} z^{-1} D_y(z)\right] V_{ref} \quad (15)$$

where N is a natural number representing the number of the digital input stimulus signals, $D_{ik}$, k=1, . . . N , are the digital input stimulus signals controlling the sampling capacitor pairs, $C_{sdk}$ is a sum of capacitance of the sampling capacitor pairs controlled by the digital input stimulus signals $D_{ik}(z)$, $$C_{sd} = \sum_{k=1}^{N} C_{sk}$$

is a sum of capacitance of all sampling capacitor pairs, $D_y$ is a digital feedback signal and $-1 \leq D_y \leq 1$, and $V_{ref}$ is half of the difference between the third reference signal (Vr1) and the fourth reference signal (Vr2). Besides, a Z-domain transfer function of the charge integrator 5' can be expressed as $$\frac{-1}{\left(1 + \frac{1}{A}\right) C_{fAV} (1 - z^{-1})} \quad (16)$$

where $C_{fAV}$ is the average capacitance of the first integrating capacitor and the second integrating capacitor, and A is the open-loop gain of the OPAUT.

The digital input stimulus signals comprise at least one low-frequency sinusoidal wave. The ALU 8 calculates a transfer function of the sinusoidal wave and obtains the open-loop gain of the OPAUT in accordance with following equation:

$$\left.\frac{D_y(j2\pi f)}{\sum_{k=1}^{N} \frac{C_{sdk}}{C_{sd}} D_{ik}(j2\pi f)}\right|_{f=f_{in}} = \frac{1}{\frac{C_{fd}}{C_{sd}}\left(1 + \frac{1}{A}\right)\left(1 - e^{-j\frac{2\pi f_{in}}{f_{clk}}}\right)} \quad (17)$$

where $f_{in}$ is a frequency of the low-frequency sinusoidal wave, $f_{clk}$ is a frequency of the clock phase, A is the open-loop gain of the OPAUT, N is a natural number representing the number of the digital input stimulus signals, $D_{ik}(z)$ are the digital input stimulus signals controlling the sampling capacitor pairs, $C_{sdk}$ is a sum of capacitance of the sampling capacitor pairs controlled by the digital input stimulus signals $D_{ik}(z)$, $$C_{sd} = \sum_{k=1}^{N} C_{sdk}$$

is a sum of capacitance of the sampling capacitor pair, $D_y$ is the digital feedback signal and $-1 \leq D_y \leq 1$, and $C_{fd}$ is a sum of capacitance of the integrating capacitor pair. Besides, the ALU 8 further obtains the open-loop gain of the OPAUT in accordance with the following equation:

$$\left.\left|\frac{D_y(j2\pi f)}{\sum_{k=1}^{N} \frac{C_{sdk}}{C_{sd}} D_{ik}(j2\pi f)}\right|\right|_{f=f_{in}} = \frac{1}{1 + \frac{1}{A}} \quad (18)$$

As shown in Eq. (18), if $f_{in}$ is far less than $f_{clk}$, then the ALU 8 calculates an inverse of an absolute value of a low-frequency gain error as the open-loop gain of the OPAUT. Approximate solutions of the open-loop gain of the OPAUT 52 calculated by the ALU 8 or other similar devices such as a digital signal processor (DSP), a microprocessor or the like are still included within the spirit and scope defined by the claims of the present invention.

Figure 6A:
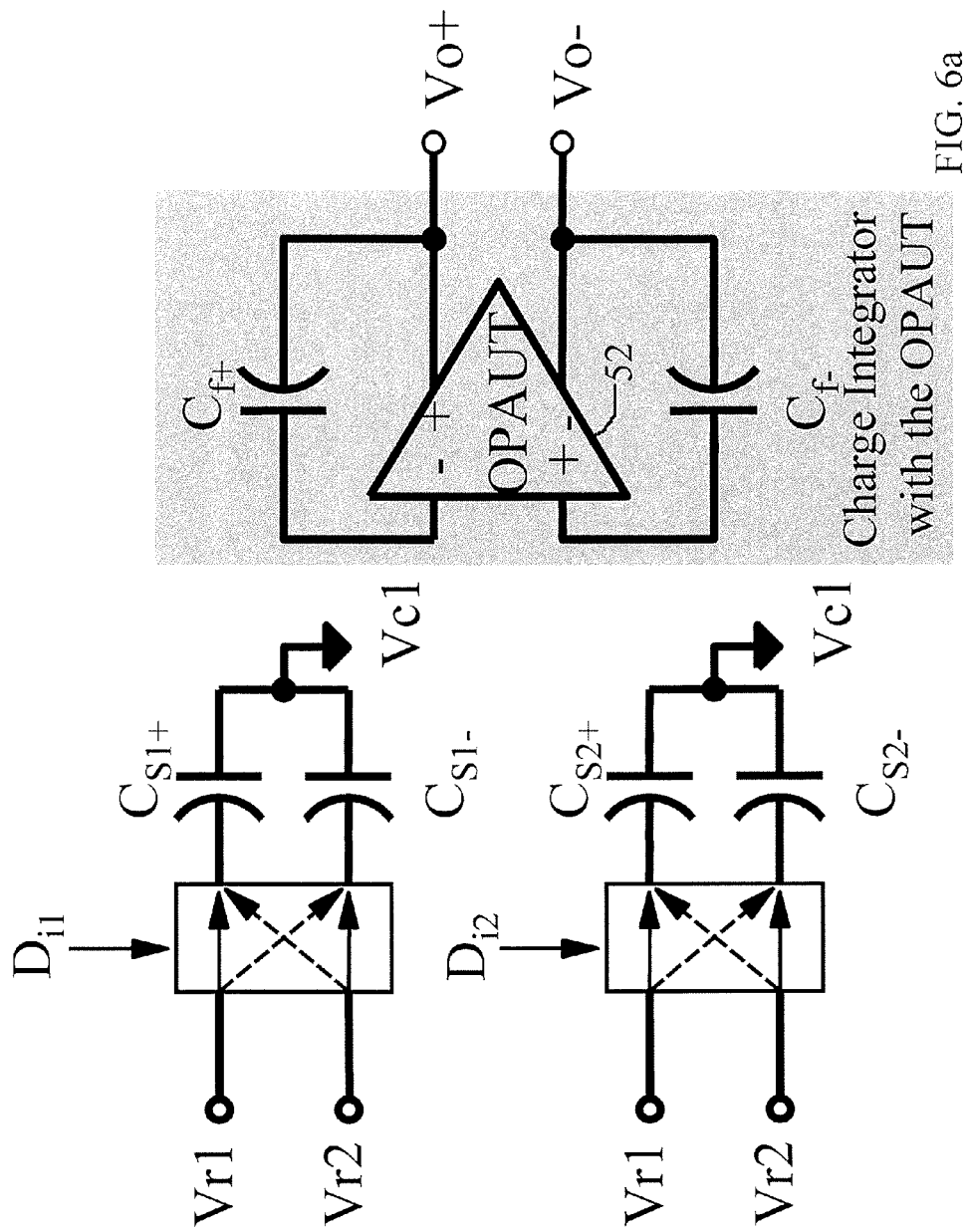

With reference to FIG. 6*a* and FIG. 6*b*, FIG. 6*a* and FIG. 6*b* show the digital DCC 4' and the charge integrator 5' of the third preferred embodiment of the present invention illustrated in FIG. 5 operated in the first clock phase and the second clock phase respectively. Each of the first and second sampling capacitors, the first and second integrating capacitors has a negative plate and a positive plate. The negative input of the OPAUT 52 is connected to the positive plate of the first integrating capacitor ($C_{f+}$). The positive output of the OPAUT 52 is connected to the negative plate of the first integrating capacitor ($C_{f+}$). The positive input of the OPAUT 52 is connected to the positive plate of the second integrating capacitor ($C_{f-}$). The negative output of the OPAUT 52 is connected to the negative plate of the second integrating capacitor ($C_{f-}$).

FIG. 6*a* shows that the device is operated in the first clock phase. In FIG. 6*a*, the arrowed solid line represents a connection condition when the digital input stimulus signals $D_{ik}$ are in the first logic state while the arrowed dash line represents a connection state when the digital input stimulus signals $D_{ik}$ are in the second logic state. When each of the digital input stimulus signals is operated in the first logic state, the corresponding negative plates of the first sampling capacitors ($C_{s1+}$, $C_{s2+}$) are connected to the third reference signal (Vr1), and the negative plates of the second sampling capacitors ($C_{s1-}$, $C_{s2-}$) are connected to the fourth reference signal (Vr2). When each of the digital input stimulus signals is operated in the second logic state, the corresponding negative plates of the first sampling capacitors ($C_{s1+}$, $C_{s2+}$) are connected to the fourth reference signal (Vr2), and the negative plates of the second sampling capacitors ($C_{s1-}$, $C_{s2-}$) are connected to the third reference signal (Vr1). The positive plates of the first sampling capacitors ($C_{s1+}$, $C_{s2+}$) and the second sampling capacitors ($C_{s1-}$, $C_{s2-}$) are connected to the first reference signal (Vc1).

FIG. 6b shows that the device is operated in the second clock phase. In FIG. 6b, the arrowed solid line represents a connection condition when the digital feedback signal $D_y$ is in the maximum logic state while the arrowed dash line represents a connection condition when the digital feedback signal $D_y$ is in the minimum logic state. The positive plates of the first sampling capacitors ($C_{s1+}$, $C_{s2+}$) are connected to the negative input of the OPAUT 52, and the positive input of the OPAUT 52 is connected to the positive plates of the second sampling capacitors ($C_{s1-}$, $C_{s2-}$). When the digital feedback signal is in the maximum logic state, the negative plates of the first sampling capacitors ($C_{s1+}$, $C_{s2+}$) are connected to the third reference signal (Vr1), and the negative plates of the second sampling capacitors ($C_{s1-}$, $C_{s2-}$) are connected to the fourth reference signal (Vr2). When the digital feedback signal is in the minimum logic state, the negative plates of the first sampling capacitors ($C_{s1+}$, $C_{s2+}$) are connected to the fourth reference signal (Vr2), and the negative plates of the second sampling capacitors ($C_{s1-}$, $C_{s2-}$) are connected to the third reference signal (Vr1).

It should be noted that the first reference signal (Vc1) could be the third reference signal (Vr1) or the fourth reference signal (Vr2) in this embodiment.

A fourth preferred embodiment of the present invention is described subsequently. In this embodiment, in addition to the components of the third embodiment, a device capable of receiving one or more digital stimulus signals and accurately measuring the open-loop gain of an OPAUT further includes at least one independently switching capacitor pair in the DCC 4'. The independently switching capacitor pair which is composed of a first independently switching capacitor ($C_{R+}$) and a second independently switching capacitor ($C_{R-}$) can independently switch the reference signals among the negative input and the positive input of the OPAUT 52 in accordance with the state of the digital feedback signal. If the OPAUT is in an ideal condition, and if the first logic state of the digital input stimulus signals is defined as +1, the second logic state of the digital input stimulus signals is defined as −1, the maximum state of the digital feedback state is defined as +1, the minimum logic state of the digital feedback signal is defined as −1 and, then a Z-domain transfer function of an outputted net charge of the DCC 4' can be expressed as $$-\left[\sum_{k=1}^{N} C_{sdk} D_{ik}(z) - C_{Rd} z^{-1} D_y(z)\right] V_{ref} \quad (19)$$

where N is a natural number representing the number of the digital input stimulus signals, $D_{ik}(z)$ are the digital input stimulus signals controlling the sampling capacitor pairs, $C_{sdk}$ is a sum of capacitance of the sampling capacitor controlled by the digital input stimulus signals, $D_y$ is the digital feedback signal and $-1 \leq D_y \leq 1$ and $C_{Rd}$ is the total capacitance of the independently switching capacitor pair. Besides, $V_{ref}$ is a difference between the third reference signal (Vr1) and the fourth reference signal (Vr2).

In this embodiment, the digital input stimulus signals include at least one low-frequency sinusoidal wave. The ALU calculates a transfer function of the sinusoidal wave and obtains the open-loop gain of the OPAUT 52 in accordance with the following equation:

$$\left. \frac{D_y(j2\pi f)}{\sum_{k=1}^{N} \frac{C_{sdk}}{C_{Rd}} D_{ik}(j2\pi f)} \right|_{f=f_{in}} = \quad (20)$$

$$\frac{1}{e^{-j\frac{2\pi f_{in}}{f_{clk}}} + \frac{1}{A}\left(1 + \frac{C_{Sd}}{C_{Rd}}\right) + \frac{C_{fd}}{C_{Rd}}\left(1 + \frac{1}{A}\right)\left(1 - e^{-j\frac{2\pi f_{in}}{f_{clk}}}\right)}$$

where $f_{in}$ is a frequency of the low-frequency sinusoidal wave, $f_{clk}$ is a frequency of the clock phase, A is the open-loop gain of the OPAUT 52, $C_{fd}$ is the total capacitance of the integrating capacitor pair, $C_{Rd}$ is the total capacitance of the independently switching capacitor pair, $C_{Sd}$ is a sum of capacitance of the sampling capacitor pairs, N is a natural number representing the number of the digital input stimulus signals.

Besides, if $f_{in}$ is far less than $f_{clk}$, then the ALU 8 further obtains the open-loop gain of the OPAUT 52 in accordance with the following equation:

$$\left\| \frac{D_y(j2\pi f)}{\sum_{k=1}^{N} \frac{C_{sdk}}{C_{Rd}} D_{ik}(j2\pi f)} \right\|_{f=f_{in}} = \frac{1}{1 + \frac{1}{A}\left(1 + \frac{C_{Sd}}{C_{Rd}}\right)} \quad (21)$$

Alternatively, the ALU 8 obtains the open-loop gain of the OPAUT 52 by multiplying an inverse of an absolute value of a low-frequency gain error by $$\left(1 + \frac{C_{sd}}{C_{Rd}}\right).$$

Approximate solutions of the open-loop gain of the OPAUT 52 calculated by a person having ordinary skill in the related field in accordance with the foregoing description and equations or figures by using the ALU 8 or other similar devices such as a digital signal processor (DSP), a microprocessor or the like are still included within the spirit and scope defined by the claims of the present invention.

Figure 7A:
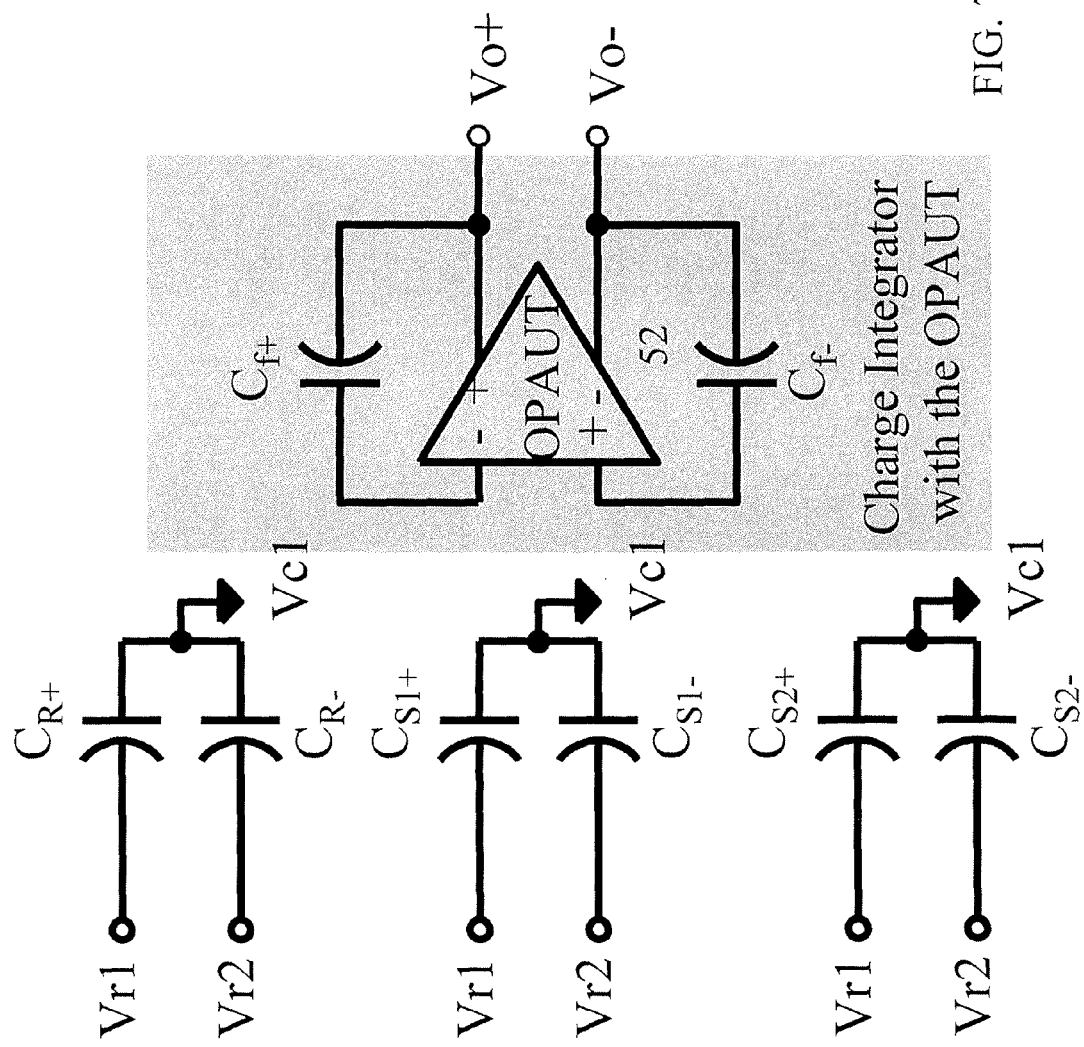
FIG. 7a and FIG. 7b are circuit diagrams showing when the digital charge converter and the charge integrator in a fourth preferred embodiment of the present invention are operated in a first clock phase and a second clock phase, respectively.
Figure 7B:
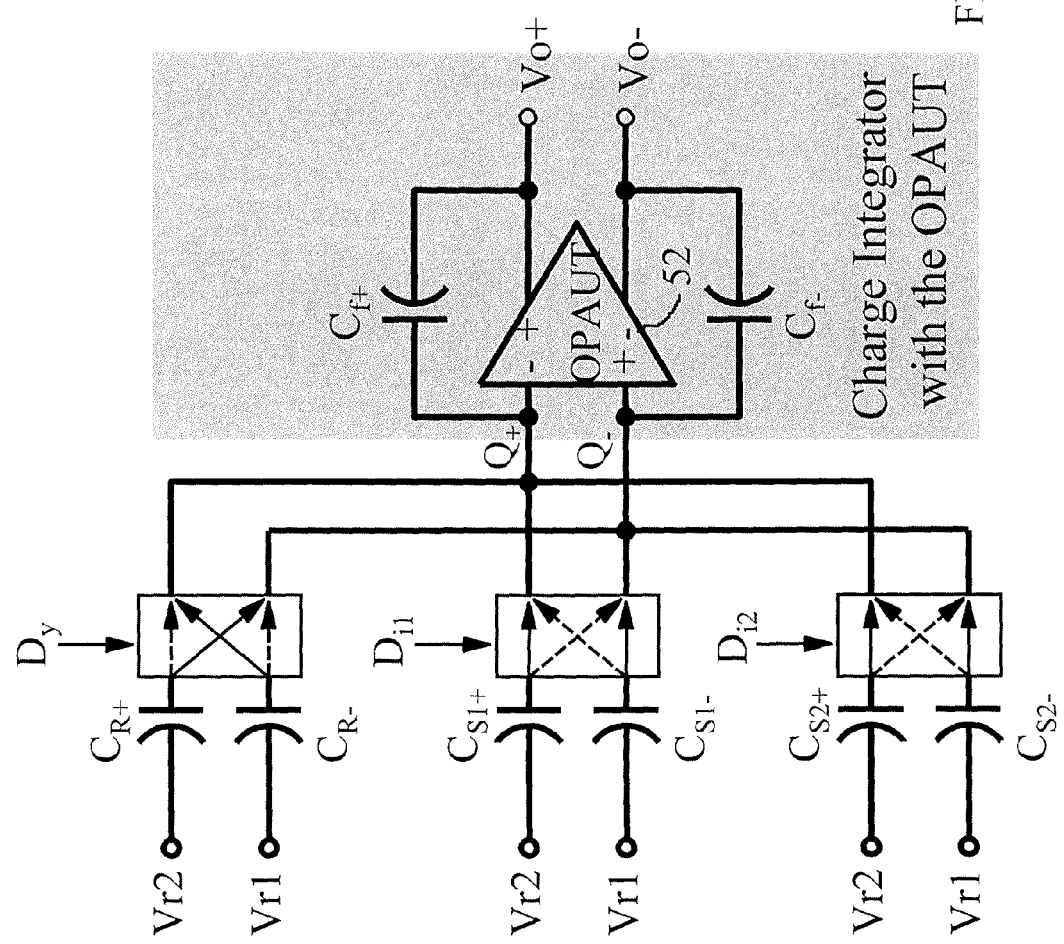

With reference to FIG. 7a and FIG. 7b, FIG. 7a and FIG. 7b show the DCC 4' and the charge integrator 5' in the fourth embodiment of the present invention operated in the first clock phase and the second clock phase respectively. The negative input of the OPAUT 52 is connected to the positive plate of the first integrating capacitor ($C_{f+}$). The positive input of the OPAUT 52 is connected to the positive plate of the second integrating capacitor ($C_{f-}$). The positive output of the OPAUT 52 is connected to the negative plate of the first integrating capacitor ($C_{f+}$). The negative output of the OPAUT 52 is connected to the negative plate of the second integrating capacitor ($C_{f-}$).

FIG. 7a shows that the device is operated in the first clock phase. The negative plates of the first sampling capacitors ($C_{s1+}$, $C_{s2+}$) of the sampling capacitor pairs and the first independently switching capacitor ($C_{R+}$) of the independently switching capacitor pair are connected to the third reference signal (Vr1). The negative plates of the second sampling capacitor(s) ($C_{s1-}$, $C_{s2-}$) and the second independently switching capacitor ($C_{R-}$) are connected to the fourth reference signal (Vr2). The positive plates of the first sampling capacitors ($C_{s1+}$, $C_{s2+}$), the second sampling capacitors ($C_{s1-}$, $C_{s2-}$), the first independently switching capacitor ($C_{R+}$) and the second independently switching capacitor ($C_{R-}$) are connected to the first reference signal (Vc1).

FIG. 7b shows that the device is operated in the second clock phase. In FIG. 7b, the arrowed solid line represents a connection condition when the digital feedback signal $D_y$ is in the maximum logic state or when the digital input stimulus signals $D_{ik}$ are in the first logic state while the arrowed dash line represents a connection condition when the digital feedback signal $D_y$ is in the minimum logic state or when the digital input stimulus signals $D_{ik}$ are in the second logic state. The negative plate of each of the first sampling capacitor(s) ($C_{s1+}$, $C_{s2+}$) and the negative plate of the first independently switching capacitor $C_{R+}$ are connected to the fourth reference signal (Vr2), and the negative plate of each of the second sampling capacitor(s) ($C_{s1-}$, $C_{s2-}$) and the negative plate of the second independently switching capacitor ($C_{R-}$) are connected to the third reference signal (Vr1). When each of the digital input stimulus signals is in the first logic state, the positive plates of the first sampling capacitors ($C_{s1+}$, $C_{s2+}$) of the corresponding sampling capacitor pairs are connected to the negative input of the OPAUT 52, and the positive plates of the second sampling capacitors ($C_{s1-}$, $C_{s2-}$) of the corresponding sampling capacitor pairs are connected to the positive input of the OPAUT 52. When each of the digital input stimulus signals is in the second logic state, the positive plates of the first sampling capacitors ($C_{s1+}$, $C_{s2+}$) of the corresponding sampling capacitor pairs are connected to the positive input of the OPAUT 52, and the positive plates of the second sampling capacitors ($C_{s1-}$, $C_{s2-}$) of the corresponding sampling capacitor pairs are connected to the negative input of the OPAUT 52. When the digital feedback signal is in the maximum logic state, the positive plate of the first independently switching capacitor ($C_{R+}$) is connected to the positive input of the OPAUT 52 and the positive plate of the second independently switching capacitor ($C_{R-}$) is connected to the negative input of the OPAUT 52. When the digital feedback signal is in the minimum logic state, the positive plate of the first independently switching capacitor ($C_{R+}$) is connected to the negative input of the OPAUT 52, and the positive plate of the second independently switching capacitor ($C_{R-}$) is connected to the positive input of the OPAUT 52.

The aforementioned fourth embodiment could also be realized by another circuit (a fifth preferred embodiment of the present invention), and the circuit diagrams will be explained it in detail when the DCC 4' and the charge integrator 5' of this embodiment are in the first clock phase and the second clock phase, respectively.

Figure 8A:
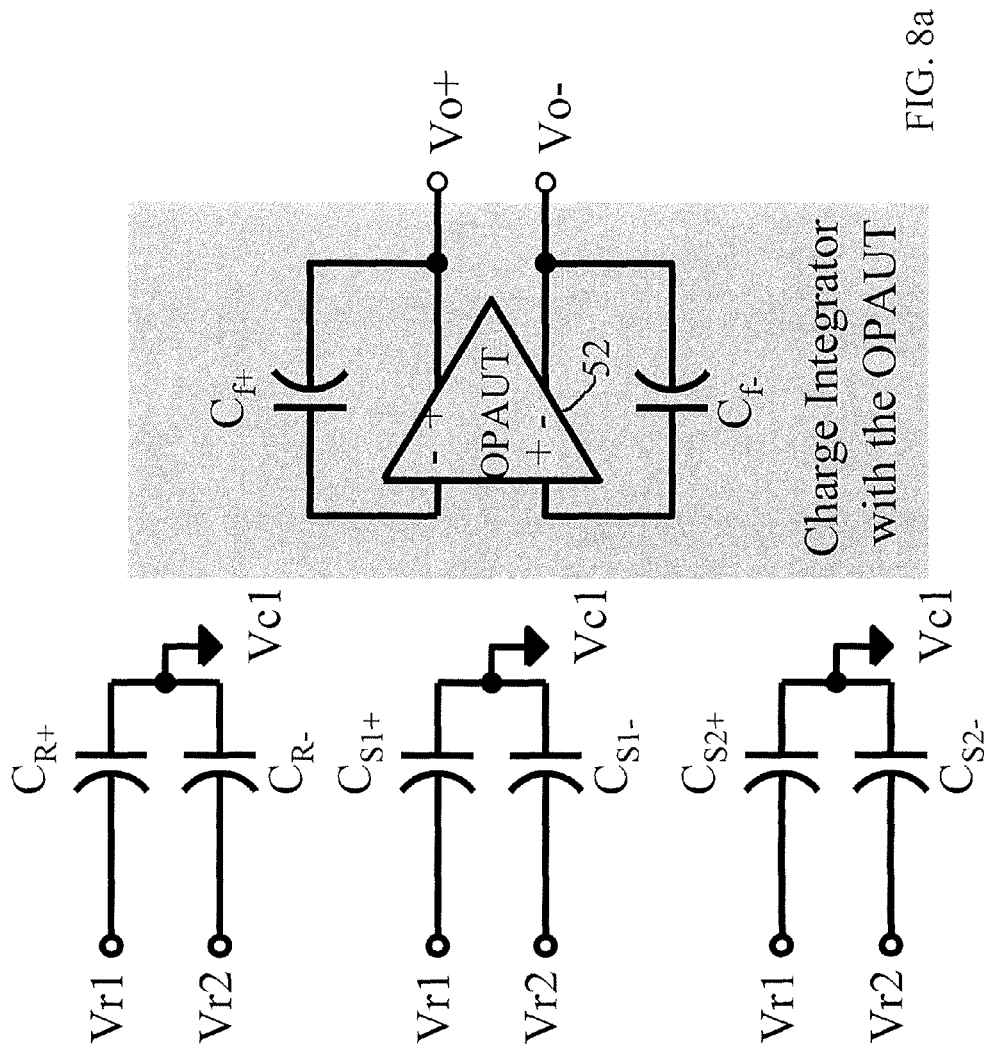
FIG. 8a and FIG. 8b are circuit diagrams showing when the digital charge converter and the charge integrator in a fifth preferred embodiment of the present invention are operated in a first clock phase and a second clock phase, respectively.
Figure 8B:
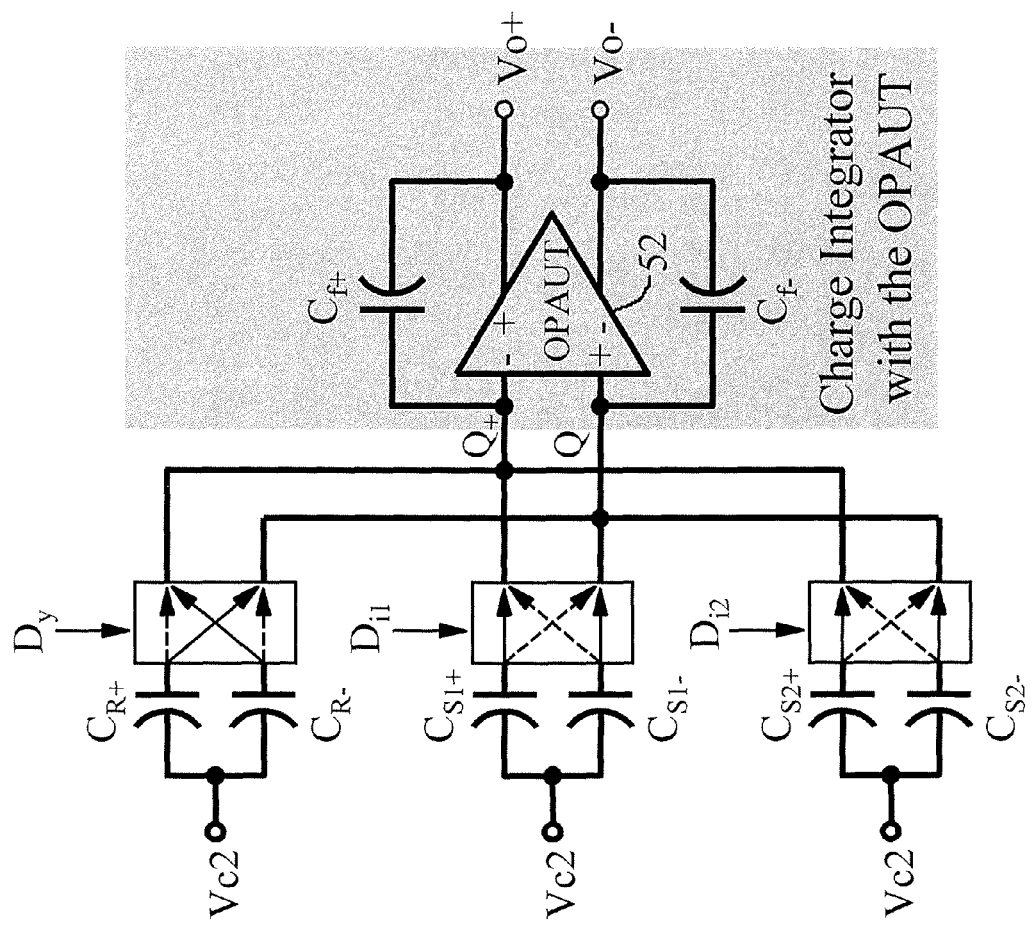

With reference to FIG. 8a and FIG. 8b, in this embodiment, the negative input of the OPAUT 52 is connected to the positive plate of the first integrating capacitor ($C_{f+}$), and the positive input of the OPAUT 52 is connected to the positive plate of the second integrating capacitor ($C_{f-}$). The positive output of the OPAUT 52 is connected to the negative plate of the first integrating capacitor ($C_{f+}$), and the negative output of the OPAUT 52 is connected to the negative plate of the second integrating capacitor ($C_{f-}$). FIG. 8a shows that the device is operated in the first clock phase, The negative plates of the first sampling capacitors ($C_{s1+}$, $C_{s2+}$) and the first independently switching capacitor ($C_{R+}$) are connected to the third reference signal (Vr1). The negative plates of the second sampling capacitors ($C_{s1-}$, $C_{s2-}$) and the second independently switching capacitor ($C_{R-}$) are connected to the fourth reference signal (Vr2). The positive plates of the first sampling capacitors ($C_{s1+}$, $C_{s2+}$), the second sampling capacitors ($C_{s1-}$, $C_{s2-}$), the first independently switching capacitor ($C_{R+}$) and the second independently switching capacitor ($C_{R-}$) are connected to the first reference signal (Vc1).

FIG. 8b shows that the device is operated in the second clock phase. In FIG. 8b, the arrowed solid line represents a connection condition when the digital feedback signal $D_y$ is in the maximum logic state or when the digital input stimulus signals $D_{ik}$ are in the first logic state while the arrowed dash line represents a connection condition when the digital feedback signal $D_y$ is in the minimum logic state or when the digital input stimulus signals $D_{ik}$ are in the second logic state. The negative plates of the first sampling capacitors ($C_{s1+}$, $C_{s2+}$), the second sampling capacitors ($C_{s1-}$, $C_{s2-}$), the first independently switching capacitor ($C_{R+}$) and the second independently switching capacitor ($C_{R-}$) are connected to the second reference signal (Vc2). When each of the digital input stimulus signals are in the first logic state, the positive plates of the first sampling capacitors ($C_{s1+}$, $C_{s2+}$) of the corresponding sampling capacitor pairs are connected to the negative input of the OPAUT 52, and the positive plates of the second sampling capacitors ($C_{s1-}$, $C_{s2-}$) of the corresponding sampling capacitor pairs are connected to the positive input of the OPAUT 52. When each of the digital input stimulus signals are in the second logic state, the positive plates of the first sampling capacitors ($C_{s1+}$, $C_{s2+}$) of the corresponding sampling capacitor pairs are connected to the positive input of the OPAUT 52, and the positive plates of the second sampling capacitors ($C_{s1-}$, $C_{s2-}$) of the corresponding sampling capacitor pairs are connected to the negative input of the OPAUT 52. When the digital feedback signal is in the maximum logic state, the positive plate of the first independently switching capacitor ($C_{R+}$) is connected to the positive input of the OPAUT 52, and the positive plate of the second independently switching capacitor ($C_{R-}$) is connected to the negative input of the OPAUT 52. When the digital feedback signal is in the minimum logic state, the positive plate of the first independently switching capacitor ($C_{R+}$) is connected to a negative input of the OPAUT 52, and the positive plate of the second independently switching capacitor ($C_{R-}$) is connected to the positive input of the OPAUT 52.

It should be noted that in the fourth and fifth embodiments, the first reference signal (Vc1) could be the second reference signal (Vc2), the third reference signal (Vr1) or the fourth reference signal (Vr2).

In sum, this invention not only can diagnose the mixed-signal circuits but also has the following advantages:
1) low cost (In addition to a small digital controller, this invention requires only several switches and capacitors for which the existing ones may be reused. It also employs much cheaper pure digital test equipment to reduce the test cost.);
2) easy testing setup (Due to pure digital interfaces the testing setup is greatly simplified.);
3) high measurement accuracy (This invention can be applied to accurately measure the OPAMP's gain no matter how high it is.);

4) insensitivity to the circuit impairments (The measurement results are very insensitive to the characteristics of the added design-for-testability components such as the capacitors and switches.); and 5) No driving issue (The OPAUT does not have to drive heavy off-chip loads as the traditional method does.)

While the present invention has been illustrated and described with the preferable embodiments but not limited therein, various modifications and changes may be made by a person having ordinary skill in the art. For example, the A/D converter could be replaced by a comparator. If variation of intensity of the digital feedback signal is caused by the bit number (two or more bits) of the A/D converter, two or more independently switching capacitors or two or more independently switching capacitor pairs may be used. If the digital-mode signal inputted to the control logic circuit is in a normal-mode state (e.g. T=0), the control logic circuit still servers to control the components (such as an operational amplifier, capacitor or the like) of the charge integrator, the DCC and the A/D converter. However, the present invention is not limited to the test-mode state mentioned in the embodiments. Accordingly, the present invention has protection scope permitted by the language of the following claims.

What is claimed is:

1. A device capable of receiving one or more digital input stimulus signals and accurately measuring an open-loop gain of an operational amplifier under test (OPAUT), the device comprising:
    a digital charge converter (DCC) comprising one or more sampling capacitors and a plurality of switches controlled by a plurality of control signals, for outputting a charge signal based on at least one of the digital input stimulus signals and a plurality of reference signals;
    a charge integrator including the OPAUT having a positive input and a negative input and at least one integrating capacitor, coupled to receive the charge signal and at least one of the reference signals, for outputting an integration signal by amplifying a potential difference across the positive input and the negative input of the OPAUT;
    an analog to digital (A/D) converter coupled to receive the integration signal and at least one of the reference signals, for outputting a digital feedback signal which comprises a maximum logic state and a minimum logic state;
    a control logic circuit coupled to receive at least one clock signal (CLK), the digital feedback signal and at least one of the digital input stimulus signals, for generating the control signals to control the switches of the DCC and the A/D converter, in which each of the digital input stimulus signals is a Sigma-Delta modulated digital stimulus bit-stream which comprises a first logic state and a second logic state, and the clock signal is utilized to generate at least two non-overlap clock phases including a first clock phase and a second clock phase; and
    an arithmetic logic unit (ALU) coupled to receive the digital input stimulus signals and the digital feedback signal, for computing an open-loop gain of the OPAUT.

2. The device according to claim 1, wherein the control logic circuit further receives a digital-mode signal which includes a normal-mode state and a test-mode state.

3. The device according to claim 2, wherein the sampling capacitors and the switches of the DCC, the OPAUT and the integrating capacitor of the charge integrator, the A/D converter and the control logic circuit reconfigure a first-order Sigma-Delta modulator capable of receiving the digital input stimulus signals when the digital-mode signal received by the control logic circuit is in the test mode.

4. The device according to claim 1, wherein the reference signals comprise a first reference signal (Vc1), a second reference signal (Vc2), a third reference signal (Vr1) and a fourth reference signal (Vr2), and a Z-domain transfer function of the DCC is expressed as:

$$-\left[\sum_{k=1}^{N} C_{sk} D_{ik}(z) - C_s z^{-1} D_y(z)\right] V_{ref} + C_s (V_{c2} - V_{c1}),$$

where:
N is a natural number representing the number of the digital input stimuli signals,
$D_{ik}$, k=1, ..., N are the digital input stimulus signals used to control the sampling capacitors,
$C_{sk}$ is a capacitance of the sampling capacitors controlled by the digital input stimulus signals,
$D_{ik}(z)$, $$C_s = \sum_{k=1}^{N} C_{sk},$$

$D_y$ is the digital feedback signal and $-1 \leq D_y \leq 1$, and
$V_{ref}$ is half of a difference between the third reference signal (Vr1) and the fourth reference signal (Vr2), when the first logic state and the second logic state of the digital input stimulus signals are defined as +1 and −1 respectively and the maximum logic state and the minimum logic state of the digital feedback signal are defined as +1 and −1 respectively.

5. The device according to claim 4, wherein each of the sampling capacitors and the integrating capacitor has a negative plate and a positive plate; the negative input of the OPAUT is connected to the positive plate of the integrating capacitor; the positive input of the OPAUT is connected to the first reference signal (Vc1); and the output of the OPAUT for the integrating signal is connected to the negative plate of the integrating capacitor $C_F$, and wherein:
    in the case that the device is operated in the first clock phase, the negative plate of each of the corresponding sampling capacitors is connected to the third reference signal (Vr1) when each of the digital input stimuli signals is in the first logic state; the negative plate of each of the corresponding sampling capacitors is connected to the fourth reference signal (Vr2) when each of the digital input stimulus signal is in the second logic state; and the positive plate of each of the sampling capacitors is connected to the second reference signal (Vc2);
    in the case that the device is operated in the second clock phase, the negative plate of each of the corresponding sampling capacitors is connected to the third reference signal (Vr1) when the digital feedback signal is in the maximum logic state; the negative plate of each of the corresponding sampling capacitors is connected to the fourth reference signal (Vr2) when the digital feedback signal is in the minimum state; and the positive plate of each of the sampling capacitors is connected to the negative input of the OPAUT.

6. The device according to claim 4, wherein the first reference signal (Vc1) corresponds to one of the second reference signal (Vc2), the third reference signal (Vr1) and the fourth reference signal (Vr2).

7. The device according to claim 6, wherein the second reference signal (Vc1) corresponds to one of the third reference signal (Vr1) and the fourth reference signal (Vr2).

8. The device according to claim 1, wherein a Z-domain transfer function of the charge integrator is expressed as:

$$\frac{-1}{\left(1+\frac{1}{A}\right)C_f} \frac{1}{1-z^{-1}},$$

where $C_f$ is a capacitance of the integrating capacitor, and A is the open-loop gain of the OPAUT.

9. The device according to claim 1, wherein the digital input stimulus signals and the digital feedback signal fulfill the following equation:

$$D_y(z) = \sum_{k=1}^{N} STF_k(z)D_{ik}(z) + NTF(z)E(z) + D_{OS}$$

where:
$D_y$ is the digital feedback signal,
$D_{ik}(z)$, $k \in \{1, \ldots, N\}$, are the digital input stimulus signals,
$STF_k(z)$ represents a signal transfer function with respect to the digital input stimulus signals $D_{ik}(z)$,
$D_{OS}$ is a constant independent of a frequency,
$E(z)$ represents a quantization error generated by the A/D converter,
$NTF(z)$ represents a noise transfer function of quantization error of the device, and
N is a natural number representing the number of the digital input stimulus signals.

10. The device according to claim 1, wherein at least one of the digital input stimulus signals comprises a low-frequency sinusoidal wave, and the ALU calculates a transfer function of the sinusoidal wave and obtains the open-loop gain of the OPAUT in accordance with the following equation:

$$\left.\frac{D_y(j2\pi f)}{\sum_{k=1}^{N} \frac{C_{sk}}{C_s} D_{ik}(j2\pi f)}\right|_{f=f_{in}} = \frac{1}{e^{-j\frac{2\pi f_{in}}{f_{clk}}} + \frac{1}{A} + \frac{C_f}{C_s}\left(1 + \frac{1}{A}\right)\left(1 - e^{-j\frac{2\pi f_{in}}{f_{clk}}}\right)},$$

where:
$f_n$ is a frequency of the low-frequency sinusoidal wave,
$f_{clk}$ is a frequency of the clock phase, A is the open-loop gain of the OPAUT, $$C_s = \sum_{k=1}^{N} C_{sk},$$

and
N is a natural number representing the number of the digital input stimulus signals.

11. The device according to claim 10, wherein the ALU calculates the transfer function of the sinusoidal wave and obtains the open-loop gain of the OPAUT in accordance with the following equation:

$$\left.\frac{D_y(j2\pi f)}{\sum_{k=1}^{N} \frac{C_{sk}}{C_s} D_{ik}(j2\pi f)}\right|_{f=f_{in}} = \frac{1}{1+\frac{1}{A}}.$$

12. The device according to claim 10, wherein the ALU calculates an inverse of an absolute value of a gain error of the low-frequency sinusoidal wave as the open-loop gain of the OPAUT.

13. The device according to claim 10, wherein the open-loop gain of the OPAUT calculated by the ALU is an approximate solution.

14. The device according to claim 1, wherein the A/D converter is a comparator.

15. The device according to claim 1, wherein the reference signals comprise a first reference signal (Vc1), a second reference signal (Vc2), a third reference signal (Vr1) and a fourth reference signal (Vr2), and the DCC further comprises at least one independently switching capacitor switching the reference signals among the negative input and the positive input of the OPAUT in accordance with the logic state of the digital feedback signal independently of the reference signals, and if the first logic state of the digital input stimulus signals is defined as +1, the second logic state of the digital input stimulus signals is defined as −1, the maximum logic state of the digital feedback signal is defined as +1, and the minimum state of the digital feedback signal is defined as −1, then a Z-domain transfer function of the DCC is expressed as:

$$-\left[\sum_{k=1}^{N} C_{sk} D_{ik}(z) - z^{-1} C_R D_y(z)\right] V_{ref} + Q_{OS},$$

where N is a natural number representing the number of the digital input stimulus signals, $D_{ik}$, 1, ..., N are the digital input stimulus signals controlling the sampling capacitors, $C_{sk}$ is a capacitance of the sampling capacitors controlled by the digital input stimulus signals $D_{ik}(x)$, $D_y$ is the digital feedback signal and $-1 \leq D_y \leq 1$, $C_R$ is a total capacitance of the independently switching capacitor, and $V_{ref}$ is half of a difference of the third reference signal (Vr1) and the fourth reference signal (Vr2).

16. The device according to claim 15, wherein a Z-domain transfer function of the charge integrator is expressed as:

$$\frac{-1}{\left(1+\frac{1}{A}\right)C_f} \frac{1}{1-z^{-1}},$$

where $C_f$ is a sum of capacitance values of the integrating capacitor, and A is the open-loop gain of the OPAUT.

17. The device according to claim 15, wherein at least one of the digital input stimulus signals comprises a low-frequency sinusoidal wave, and the ALU calculates a transfer function of the sinusoidal wave and obtains the open-loop gain of the OPAUT in accordance with the following equation:

$$\left. \frac{D_y(j2\pi f)}{\sum_{k=1}^{N} \frac{C_{sk}}{C_R} D_{ik}(j2\pi f)} \right|_{f=f_{in}} =$$

$$\frac{1}{e^{-j\frac{2\pi f_{in}}{f_{clk}}} + \frac{1}{A}\left(1+\frac{C_S}{C_R}\right) + \frac{C_f}{C_R}\left(1+\frac{1}{A}\right)\left(1-e^{-j\frac{2\pi f_{in}}{f_{clk}}}\right)},$$

where $f_n$ is a frequency of the low-frequency sinusoidal wave, $f_{clk}$ is a frequency of the clock phases, A is the open-loop gain of the OPAUT, $C_S$ is a sum of capacitance values of the sampling capacitors, and N is a natural number representing the number of the digital input stimulus signals.

18. The device according to claim 17, wherein the ALU calculates the transfer function of the sinusoidal wave and obtains the open-loop gain of the OPAUT in accordance with the following equation:

$$\left\| \frac{D_y(j2\pi f)}{\sum_{k=1}^{N} \frac{C_{sk}}{C_R} D_{ik}(j2\pi f)} \right\|_{f=f_{in}} = \frac{1}{1 + \frac{1}{A}\left(1+\frac{C_S}{C_R}\right)}.$$

19. The device according to claim 17, wherein each of the digital input stimulus signals comprises a low-frequency sinusoidal wave with an identical frequency and magnitude, and the ALU calculates the open-loop gain of the OPAUT by multiplying an inverse of an absolute value of a gain error of the low-frequency sinusoidal wave by $$\left(1 + \frac{C_S}{C_R}\right).$$

20. The device according to claim 17, wherein the open-loop gain of the OPAUT calculated by the ALU is an approximate solution.

21. The device according to claim 15, wherein the negative input of the OPAUT is connected to the positive plate of the integrating capacitor ($C_f$), the positive input of the OPAUT is connected to the first reference signal (Vc1) and the output of the integration signal of the OPAUT is connected to the negative plate of the integrating capacitor ($C_f$);

and wherein:
in the case that the device is operated in the first clock phase, the negative plate of the independently switching capacitor ($C_R$) is connected to the second reference signal (Vc2), the negative plate of each of the corresponding sampling capacitors is connected to the third reference signal (Vr1) when each of the digital input stimulus signals is in the first logic state; and the negative plate of each of the corresponding sampling capacitors is connected to the fourth reference signal (Vr2) when each of the digital input stimulus signals is in the second logic state; and the positive plates of the sampling capacitors ($C_S$) and the independently switching capacitor ($C_R$) are connected to the first reference signal (Vc1);
in the case that the device is operated in the second clock phase, the negative plate of the independently switching capacitor ($C_R$) is connected to the third reference signal (Vr1) when the digital feedback signal is in the maximum state; the negative plate of the independently switching capacitor ($C_R$) is connected to the fourth reference signal (Vr2) when the digital feedback signal is in the minimum logic state; the negative plates of the sampling capacitors are connected to the second reference signal (Vc2); and the positive plates of the independently switching capacitor ($C_R$) and the sampling capacitors are connected to the negative input of the OPAUT.

22. A device capable of receiving one or more digital input stimulus signals and accurately measuring an open-loop gain of an operational amplifier under test (OPAUT), the device comprising:
a digital charge converter (DCC) comprising one or more sampling capacitor pairs and a plurality of switches controlled by a plurality of control signals, for outputting a pair of charge signals based on at least one of the digital input stimulus signals and reference signals, wherein each of the sampling capacitor pairs is composed of a first sampling capacitor ($C_{sk+}$) and a second sampling capacitor ($C_{sk-}$);
a control logic circuit coupled to receive at least one clock signal (CLK), a digital feedback signal and at least one of the digital input stimulus signals, for generating the control signals to control the switches of the DCC, in which each of the digital input stimulus signals is a Sigma-Delta modulated digital stimulus bit-stream which comprises a first logic state and a second logic state, and the clock signal is utilized to generate at least two non-overlap clock phases including a first clock phase and a second clock phase;
a charge integrator including the OPAUT with differential-ended outputs and at least one integrating capacitor pair, coupled to receive the pair of the charge signals of the DCC, for outputting an integration signal, in which the integrating capacitor pair is composed of a first integrating capacitor ($C_{f+}$) and a second integrating capacitor ($C_{f-}$), and the integration signal being generated at the differential-ended outputs of the OPAUT by amplifying a potential difference across a positive input and a negative input of the OPAUT;
an A/D converter (ADC) coupled to receive the integration signal of the charge integrator, for outputting the digital feedback signal which includes a maximum logic state and a minimum logic state; and
an arithmetic logic unit (ALU) coupled to receive the digital input stimulus signals and the digital feedback signal, for calculating an open-loop gain of the OPAUT.

23. The device according to claim 22, wherein the control logic circuit further receives a digital-mode signal which includes a normal-mode state and a test-mode state.

24. The device according to claim 23, wherein, when the digital-mode signal received by the control logic circuit is in the test-mode state, the switches and the sampling capacitor pairs of the DCC, the OPAUT and the integrating capacitor pair of the charge integrator, the A/D converter and the control logic circuit reconfigure a first-order Sigma-Delta modulator for receiving the digital input stimulus signals, and the digital input stimulus signals and the digital feedback signal fulfill the following equation:

$$D_y(z) = \sum_{k=1}^{N} STF_k(z)D_{ik}(z) + NTF(z)E(z) + D_{OS},$$

where N is a natural number representing the number of the digital input stimulus signals, $D_y$ is the digital feedback signal, $D_{OS}$ is a constant independent of a frequency, $D_{ik}(z)$, $k \in \{1, \ldots, N\}$, are the digital input stimulus signals, $STF_k(z)$ represents a signal transfer function with respect to the digital input stimulus signals $D_{ik}(z)$, $E(z)$ represents a quantization error generated by the A/D converter, and $NTF(z)$ represents the noise transfer function of quantization error of the device.

25. The device according to claim 22, wherein the reference signals comprise a first reference signal (Vc1), a second reference signal (Vc2), a third reference signal (Vr1) and a fourth reference signal (Vr2), and wherein if the first logic state of the digital input stimulus signals is defined as +1, the second logic state of the digital input stimulus signals is defined as −1, the maximum logic state of the digital feedback signal is defined as +1 and the minimum logic state of the digital feedback signal is defined as −1, then a Z-domain transfer function of an outputted net charge of the DCC can be expressed as $$-\left[\sum_{k=1}^{N} C_{sk} D_{ik}(z) - C_s z^{-1} D_y(z)\right] V_{ref} + C_s(V_{c2} - V_{c1}),$$

where N is a natural number representing the number of the digital input stimulus signals, $D_{ik}$, $k=1, \ldots, N$, are the digital input stimulus signals controlling the sampling capacitor pairs, $C_{sdk}$ is a sum of capacitance of the sampling capacitor pairs controlled by the digital input stimulus signals $D_{ik}(z)$, $C_{SD}$ equal to $$\sum_{k=1}^{N} C_{sdk}$$

is a sum of capacitance of all the sampling capacitor pairs, $D_y$ is the digital feedback signal and $-1 \leq D_y \leq 1$, and $V_{ref}$ is half of a difference between the third reference signal (Vr1) and the fourth reference signal (Vr2).

26. The device according to claim 22, wherein a Z-domain transfer function of the charge integrator is expressed as:

$$\frac{-1}{C_{fAV}\left(1+\frac{1}{A}\right)(1-z^{-1})},$$

where $C_{fAV}$ is half of a total capacitance of the integrating capacitor pair.

27. The device according to claim 22, wherein the digital input stimulus signals and the digital feedback signal fulfill the following equation:

$$D_y(z) = \sum_{k=1}^{N} STF_k(z) D_{ik}(z) + NTF(z) E(z) + D_C$$

where $D_y$ is the digital feedback signal, $D_C$ is a constant independent of the circuit and the reference signals, N is a natural number representing the number of the digital input stimulus signals, $D_{ik}(z)$, $k \in \{1, \ldots, N\}$, are the digital input stimulus signals, $STF_k(z)$ represents the signal transfer function with respect to the digital input stimulus signals $D_{ik}(z)$ $NTF(z)$ represent the noise transfer function of quantization error of the device, and $E(z)$ represents an quantization error generated by the A/D converter.

28. The device according to claim 22, wherein one or more of the digital input stimulus signals comprises a low-frequency sinusoidal wave, and the ALU calculates a transfer function of the sinusoidal wave and obtains the open-loop gain of the OPAUT in accordance with the following equation:

$$\left|\frac{D_y(j2\pi f)}{\sum_{k=1}^{N} \frac{C_{sdk}}{C_{SD}} D_{ik}(j2\pi f)}\right|_{f=f_{in}} = \frac{1}{\frac{C_{FD}}{C_{SD}}\left(1+\frac{1}{A}\right)\left(1-e^{-j\frac{2\pi f_{in}}{f_{clk}}}\right)}$$

where $f_n$ is a frequency of the low-frequency sinusoidal wave, $f_{clk}$ is a frequency of the clock phases, A is the open-loop gain of the OPAUT, N is a natural number representing the number of the digital input stimulus signals, $D_{ik}(z)$ are the digital input stimulus signals controlling the sampling capacitor pairs, $C_{sdk}$ is a sum of capacitance of the sampling capacitor pairs controlled by the digital input stimulus signals $D_{ik}(z)$ $C_{SD}$ equal to $$\sum_{k=1}^{N} C_{sdk}$$

is a sum of capacitance of all the sampling capacitor pairs, $D_y$ is the digital feedback signal and $-1 \leq D_y \leq 1$, and $C_{FD}$ is a sum of capacitance of the integrating capacitor pairs.

29. The device according to claim 28, wherein the ALU calculates the transfer function of the sinusoidal wave and obtains the open-loop gain of the OPAUT in accordance with the following equation:

$$\left|\frac{D_y(j2\pi f)}{\sum_{k=1}^{N} \frac{C_{sdk}}{C_{SD}} D_{ik}(j2\pi f)}\right|_{f=f_{in}} = \frac{1}{1+\frac{1}{A}}.$$

30. The device according to claim 28, wherein the ALU calculates an inverse of an absolute value of a low-frequency gain error as the open-loop gain of the OPAUT.

31. The device according to claim 28, wherein the open-loop gain of the OPAUT calculated by the ALU is an approximate solution.

32. The device according to claim 22, wherein the A/D converter is a comparator.

33. The device according to claim 22, wherein the reference signals comprise a first reference signal (Vc1), a third reference signal (Vr1) and a fourth reference signal (Vr2); each of the first, second sampling capacitors, the first and second integrating capacitors includes a negative plate and a positive plate; the negative input of the OPAUT is connected to the positive plate of the first integrating capacitor; the positive output of the OPAUT is connected to the negative plate of the first integrating capacitor; the positive input of the OPAUT is connected to the positive plate of the second integrating capacitor; and the negative output of the OPAUT is connected to the negative plate of the second integrating capacitor;

and wherein:

in the case that the device is operated in the first clock phase, the negative plates of the corresponding first sampling capacitors are connected to the third reference signal (Vr1), and the negative plates of the second sampling capacitors are connected to the fourth reference signal (Vr2) when each of the digital input stimulus signals is in the first logic state; the negative plates of the corresponding first sampling capacitors are connected to the fourth reference signal (Vr2), and the negative plates of the second sampling capacitors are connected to the third reference signal (Vr1) when each of the digital input stimulus signals is in the second logic state; and the positive plates of the first sampling capacitors and the second sampling capacitors are connected to the first reference signal (Vc1);

in the case that the device is operated in the second clock phase, the negative plates of the first sampling capacitors are connected to the third reference signal (Vr1), and the negative plates of the second sampling capacitors are connected to the fourth reference signal (Vr2) when the digital feedback signal is in the maximum logic state; the negative plates of the first sampling capacitors are connected to the fourth reference signal (Vr2), and the negative plates of the second sampling capacitors are connected to the third reference signal (Vr1) when the digital feedback signal is in the minimum logic state; the positive plates of the first sampling capacitors are connected to the negative input of the OPAUT; and the positive input of the OPAUT is connected to the positive plates of the second sampling capacitors.

34. The device according to claim 33, wherein the first reference signal (Vc1) corresponds to one of the third reference signal (Vr1) and the fourth reference signal (Vr2).

35. The device according to claim 22, wherein the DCC further comprises at least one independently switching capacitor pair which is composed of a first independent switching capacitor and a second independent switching capacitor and independently switches the reference signals among the negative input and the positive input of the OPAUT in accordance with the logic state of the digital feedback signal, and wherein if the first logic state of the digital input stimulus signals is defined as +1, the second logic state of the digital input stimulus signals is defined as −1, the maximum logic state of the digital feedback signal is defined as +1, and the minimum logic state of the digital feedback signal is defined as −1, then a Z-domain transfer function of the outputted net charge of the DCC can be expressed as:

$$-\left[\sum_{k=1}^{N} C_{sk} D_{ik}(z) - C_s z^{-1} D_y(z)\right] V_{ref} + C_s (V_{c2} - V_{c1}),$$

where N is a natural number representing the number of the digital input stimulus signals, $D_{ik}(z)$ are the digital input stimulus signals controlling the sampling capacitor pairs, $C_{sdk}$ is a sum of capacitance of the sampling capacitor pairs controlled by the digital input stimulus signals $D_{ik}(z)$, $D_y$ is the digital feedback signal and $-1 \leq D_y \leq 1$, $C_{RD}$ is a total capacitance of the independently switching capacitor pair.

36. The device according to claim 35, wherein $V_{ref}$ is half of a difference of the third reference signal (Vr1) and the fourth reference signal (Vr2).

37. The device according to claim 36, wherein the negative input of the OPAUT is connected to the positive plate of the first integrating capacitor; the positive input of the OPAUT is connected to the positive plate of the second integrating capacitor; the positive output of the OPAUT is connected to the negative plate of the first integrating capacitor and the negative output of the OPAUT is connected to the negative plate of the second integrating capacitor;

and wherein:

in the case that the device is operated in the first clock phase, the negative plates of the first sampling capacitors and the first independently switching capacitor are connected to the third reference signal (Vr1); the negative plates of the second sampling capacitors and the second independently switching capacitor are connected to the fourth reference signal (Vr2); and the positive plates of the first sampling capacitors, the second sampling capacitors, the first independently switching capacitor and the second independently switching capacitor are connected to the first reference signal (Vc1);

in the case that the device is operated in the second clock phase, the negative plates of the first sampling capacitors, the second sampling capacitors, the first independently switching capacitor and the second independently switching capacitor are connected to the second reference signal (Vc2);

when each of the digital input stimulus signals is in the first logic state, the positive plates of the first sampling capacitors of the corresponding sampling capacitor pairs are connected to the negative input of the OPAUT, and the positive plates of the second sampling capacitors of the corresponding sampling capacitor pairs are connected to the positive input of the OPAUT;

when each of the digital input stimulus signals is in the second logic state, the positive plates of the first sampling capacitors of the corresponding sampling capacitor pair are connected to the positive input of the OPAUT, and the positive plates of the second sampling capacitors of the corresponding sampling capacitor pairs are connected to the negative input of the OPAUT;

when the digital feedback signal is in the maximum logic state, the positive plates of the first independently switching capacitor is connected to the positive input of the OPAUT, and the positive plate of the second independently switching capacitor is connected to the negative input of the OPAUT;

when the digital feedback signal is in the minimum logic state, the positive plate of the first independently switching capacitor is connected to the negative input of the OPAUT, and the positive plate of the second independently switching capacitor is connected to the positive input of the OPAUT.

38. The device according to claim 37, wherein the second reference signal (Vc1) corresponds to one of the third reference signal (Vr1) and the fourth reference signal (Vr2).

39. The device according to claim 35, wherein $V_{ref}$ is a difference of the third reference signal (Vr1) and the fourth reference signal (Vr2).

40. The device according to claim 39, wherein the negative input of the OPAUT is connected to the positive plate of the first integrating capacitor; the positive input of the OPAUT is connected to the positive plate of the second integrating capacitor; the positive output of the OPAUT is connected to the negative plate of the first integrating capacitor; the negative output of the OPAUT is connected to the negative plate of the second integrating capacitor;

and wherein:

in the case that the device is operated in the first clock phase, the negative plates of the first sampling capacitors and the first independently switching capacitor of the independently switching capacitor pair are connected to the third reference signal (Vr1); the negative plates of the second sampling capacitors and the second independently switching capacitor are connected to the fourth reference signal (Vr2); and the positive plates of the first sampling capacitors, the second sampling capacitors, the first independently switching capacitor and the second independently switching capacitor are connected to the first reference signal (Vc1);

in the case that the device is operated in the second clock phase, the negative plates of the first sampling capacitors and the negative plate of the first independently switching capacitor are connected to the fourth reference signal (Vr2); and the negative plates of the second sampling capacitors and the negative plate of the second independently switching capacitor are connected to the third reference signal (Vr1);

when each of the digital input stimulus signals is in the first logic state, the positive plates of the first sampling capacitors of the corresponding sampling capacitor pairs are connected to the negative input of the OPAUT, and the positive plates of the second sampling capacitors of the corresponding sampling capacitor pairs are connected to the positive input of the OPAUT;

when each of the digital input stimulus signals is in the second logic state, the positive plates of the first sampling capacitors of the corresponding sampling capacitor pairs are connected to the positive input of the OPAUT and the positive plates of the second sampling capacitors of the corresponding sampling capacitor pairs are connected to the negative input of the OPAUT;

when the digital feedback signal is in the maximum logic state, the positive plate of the first independently switching capacitor is connected to the positive input of the OPAUT, and the positive plate of the second independently switching capacitor is connected to the negative input of the OPAUT; and when the digital feedback signal is in the minimum logic state, the positive plate of the first independently switching capacitor is connected to the negative input of the OPAUT, and the positive plate of the second independently switching capacitor is connected to the positive input of the OPAUT.

41. The device according to claim 40, wherein the first reference signal (Vc1) corresponds to one of the second reference signal (Vc2), the third reference signal (Vr1) and the fourth reference signal (Vr2).

42. The device according to claim 35, wherein a Z-domain transfer function of the charge integrator can be expressed as:

$$\frac{-1}{C_{fAV}\left(1+\frac{1}{A}\right)(1-z^{-1})},$$

where $C_{fAV}$ is half of a sum of capacitance of the integrating capacitor pair.

43. The device according to claim 35, wherein at least one of the digital input stimulus signals comprises a low-frequency sinusoidal wave, and the ALU calculates a transfer function of the sinusoidal wave and obtains the open-loop gain of the OPAUT in accordance with the following equation:

$$\left.\frac{D_y(j2\pi f)}{\sum_{k=1}^{N}\frac{C_{sdk}}{C_{RD}}D_{ik}(j2\pi f)}\right|_{f=f_{in}} = \frac{1}{e^{-j\frac{2\pi f_{in}}{f_{clk}}}+\frac{1}{A}+\left(1+\frac{C_{SD}}{C_{RD}}\right)+\frac{C_{FD}}{C_{RD}}\left(1+\frac{1}{A}\right)\left(1-e^{-j\frac{2\pi f_{in}}{f_{clk}}}\right)}$$

wherein $f_{in}$ is a frequency of the low-frequency sinusoidal wave, $f_{clk}$ is a frequency of the clock phase, A is the open-loop gain of the OPAUT, $C_{FD}$ is a sum of capacitance of the integrating capacitor pair, $C_{SD}$ equal to $$\sum_{k=1}^{N}C_{sdk}$$

is a sum of capacitance of all the sampling capacitor pairs, and N is a natural number representing the number of the digital input stimulus signals.

44. The device according to claim 43, wherein the ALU calculates a transfer function of the sinusoidal wave and obtains the open-loop gain of the OPAUT in accordance with the following equation:

$$\left.\frac{D_y(j2\pi f)}{\sum_{k=1}^{N}\frac{C_{sdk}}{C_{RD}}D_{ik}(j2\pi f)}\right|_{f=f_{in}} = \frac{1}{1+\frac{1}{A}\left(1+\frac{C_{SD}}{C_{RD}}\right)}.$$

45. The device according to claim 43, wherein the ALU calculates the open-loop gain of the OPAUT by multiplying an inverse of an absolute value of a gain error of the low-frequency sinusoidal wave by $$\left(1+\frac{C_{SD}}{C_{RD}}\right).$$

46. The device according to claim 43, wherein the open-loop gain calculated by the OPAUT is an approximate solution.

* * * * *